United States Patent
Saligram et al.

(10) Patent No.: US 8,148,853 B2
(45) Date of Patent: Apr. 3, 2012

(54) SWITCHING METHOD AND APPARATUS

(75) Inventors: Narayana Prakash Saligram, Bangalore (IN); Sreejakumar Sreekantan Nair, Karnataka (IN); Pradeep Thalli, Karnataka (IN)

(73) Assignee: American Power Conversion Corporation, West Kingston, RI (US)

( * ) Notice: Subject to any disclaimer, the term of this patent is extended or adjusted under 35 U.S.C. 154(b) by 145 days.

(21) Appl. No.: 12/649,680

(22) Filed: Dec. 30, 2009

(65) Prior Publication Data

US 2011/0156495 A1    Jun. 30, 2011

(51) Int. Cl.
*H01H 47/00* (2006.01)
*H01H 35/00* (2006.01)
*H01H 83/18* (2006.01)
*H02H 3/02* (2006.01)
*H02H 3/42* (2006.01)

(52) U.S. Cl. ...................................... 307/126
(58) Field of Classification Search .................. 307/115, 307/126, 141, 141.4
See application file for complete search history.

(56) References Cited

U.S. PATENT DOCUMENTS

| | | | |
|---|---|---|---|
| 4,562,506 A | 12/1985 | Moran | |
| 4,564,767 A | 1/1986 | Charych | |
| 4,683,529 A | 7/1987 | Bucher, II | |
| 4,763,013 A | 8/1988 | Gvoth, Jr. et al. | |
| 5,272,613 A | 12/1993 | Buthker | |
| 5,684,688 A | 11/1997 | Rouaud et al. | |
| 5,841,268 A | 11/1998 | Mednik | |
| 6,051,961 A | 4/2000 | Jang et al. | |
| 6,353,547 B1 | 3/2002 | Jang et al. | |
| 2002/0044469 A1 | 4/2002 | Yasumura | |
| 2002/0130556 A1 | 9/2002 | Hohri | |
| 2002/0191425 A1 | 12/2002 | Geissler | |

OTHER PUBLICATIONS

Hua, Guichao, "Novel Zero-Currant-Transition PWM Converters", Proceedings of the Annual Power Electronics Specialists Conference, IEEE, Seattle Jun. 20-25, 1993.
Hua, Guichao, "Novel Zero-Voltage-Transition PWM Converters", IEEE Transactions on Power Electronics, vol. 9, No. 2, Mar. 1994, pp. 213-219.

*Primary Examiner* — Jared Fureman
*Assistant Examiner* — Carlos Amaya
(74) *Attorney, Agent, or Firm* — Lando & Anastasi, LLP

(57) ABSTRACT

A switch circuit and method for converting a hard switch into a soft switch. In one example, the circuit includes a first switch having a first node and a second node, and a switch control circuit coupled in parallel with the first switch between the first and second nodes. The switch control circuit includes a series resonant circuit including a capacitor and an inductor coupled together in series, a second switch coupled in parallel with the series resonant circuit, a third switch coupled in series between the first node and the series resonant circuit, and a first diode coupled between the series resonant circuit and the second node, an negative terminal of the first diode being coupled to the second node.

20 Claims, 26 Drawing Sheets

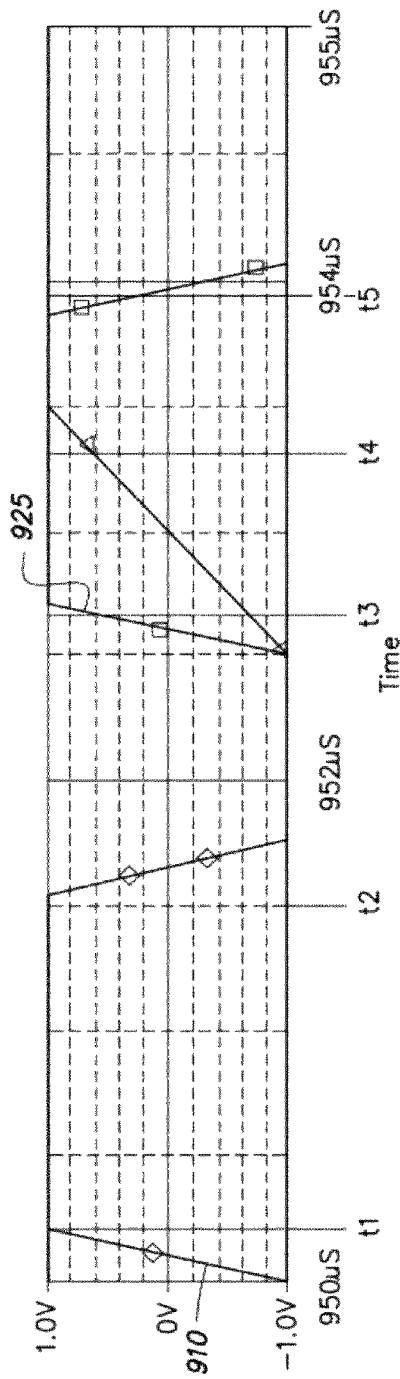
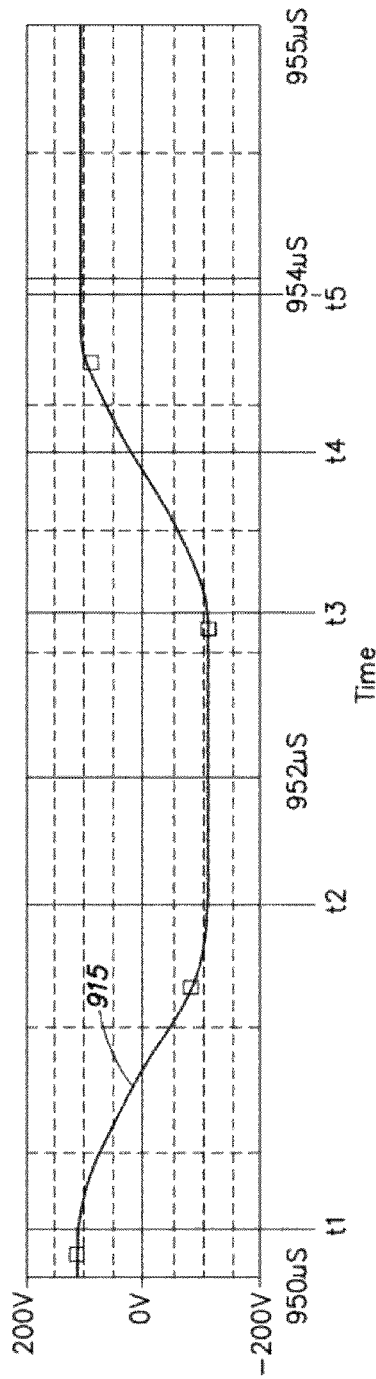
FIG. 9B
FIG. 9C

SWITCHING METHOD AND APPARATUS

BACKGROUND

1. Field of Invention

The present invention is in the field of electronic circuits and, more particularly, is directed to a switch circuit and method of operating same.

2. Discussion of Related Art

When a switch makes or breaks a circuit connecting a voltage source to a load, there is power loss that occurs in the switch during the transition. FIG. 1 illustrates a basic circuit diagram of a voltage source 100 connected to a load 110 via a switch 120 and diode 130. Those skilled in the art will appreciate that although the diode 130 is illustrated separate from the switch 120, the diode 130 may be integrated with and a part of the switch 120. When the switch 120 is opened or turned off (from the closed/on position), during the transition period from on to off, the current in the switch falls, and the voltage across the switch rises, as shown in FIG. 2A. FIG. 2A illustrates a graph of the current (trace 210) and voltage (trace 220) in the switch (with units amps and volts, respectively, on the vertical axis) as a function of time (in microseconds on the horizontal axis). During the on-off transition, there is a period during which both current and voltage are present in the switch, referred to as the period of overlap, as can be seen in FIG. 2A. During this period of overlap, power loss in the switch 120 can be observed, as shown in FIG. 2B. In the illustrated example, for a voltage source operating at approximately 100 Volts (V) and 10 Amps (A), as shown in FIG. 2A, the power loss in the switch 120 is approximately 250 Watts (W), as shown in FIG. 2B. A similar loss is experienced during turn-on of the switch 120, as illustrated in FIG. 2C, during the period of overlap illustrated in FIG. 2D.

This problem may be even more pronounced in the case where the switch 120 connects the voltage source 100 to the load 110 via a current source 140, as shown in FIG. 3. This is the case in many power electronics applications. FIG. 4A illustrates a graph of switch current (trace 410) and voltage (trace 420) as a function of time for the circuit of FIG. 3. During the turn-off transition, the current 410 in the switch 120 falls, and the voltage 420 across the switch 120 rises, as shown in FIG. 4A. Power loss is experienced in the switch 120 during the period of overlap when current and voltage are both present in the switch, as shown in FIG. 4B. As can be seen from a comparison of FIGS. 2B and 4B, the power loss is greater (about 1 kilowatt (kW) versus 250 W) for the circuit of FIG. 3. During turn-on, the voltage 420 across the switch drops and the current 410 rises, as shown in FIG. 4C, and a similar power loss is experienced during the transition, as shown in FIG. 4D.

SUMMARY OF INVENTION

Aspects and embodiments are directed to a switching method and apparatus that may significantly reduce the losses associated with conventional switches and may be applied to a wide variety of switching topologies.

According to one embodiment, a switch circuit comprises a first switch having a first node and a second node, and a switch control circuit coupled in parallel with the first switch between the first and second nodes. The switch control circuit comprises a series resonant circuit including a capacitor and an inductor coupled together in series, a second switch coupled in parallel with the series resonant circuit, a third switch coupled in series between the first node and the series resonant circuit, and a first diode coupled between the series resonant circuit and the second node, a negative terminal of the first diode being coupled to the second node.

In one example, the switch circuit further comprises a second diode coupled between the second switch and a junction point of the series resonant circuit and the first diode. In another example, the switch circuit further comprises a controller coupled to each of the first, second and third switches and configured to provide control signals to turn the first, second and third switches on and off. In one example, prior to turn on or turn off of the first switch, the controller is configured to control the third switch to reverse a polarity of a voltage across the capacitor. The controller may be further configured to turn on the second switch, after the polarity of the voltage across the capacitor has been reversed, to discharge the capacitor. The controller may be further configured to turn the first switch on or off at approximately at zero-crossing point of the voltage across the capacitor.

Another embodiment is directed to a method of operating a control circuit to actuate a switch, the control circuit comprising a series resonant circuit including a capacitor and an inductor, a first auxiliary switch coupled between a first node of the switch and an input of the series resonant circuit, a diode coupled between an output of the series resonant circuit and a second node of the switch, and a second auxiliary switch coupled in parallel with the series resonant circuit. The method comprises turning on the second auxiliary switch, turning off the second auxiliary switch after a polarity of a voltage across the capacitor has been reversed, turning on the first auxiliary switch to discharge the capacitor, and actuating the switch at approximately a zero-crossing point of the voltage across the capacitor.

In one example, the method further comprises turning off the first auxiliary switch after turning on the switch. In one example, wherein a time period between turning on the second auxiliary switch and turning off the second auxiliary switch is at least $\pi\sqrt{LC}$, wherein L is a value of an inductance of the inductor of the series resonant circuit and C is a value of a capacitance of the capacitor of the series resonant circuit.

According to another embodiment, a method of operating a switch comprises reducing a voltage across the switch to approximately zero responsive to an instruction to turn on the switch, closing the switch when the voltage across the switch is approximately zero, reducing a current through the switch to approximately zero responsive to an instruction to turn off the switch, and opening the switch when the current is approximately zero. In one example, of the method, reducing the voltage across the switch includes generating a resonant current in a resonant circuit coupled in parallel with the switch. In another example, reducing the current through the switch includes generating a resonant current in a resonant circuit coupled in parallel with the switch.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Any embodiment disclosed herein may be combined with any other embodiment in any manner consistent with at least one of the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment.

The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. Where technical features in the figures, detailed description or any claim are followed by references signs, the reference signs have been included for the sole purpose of increasing the intelligibility of the figures, detailed description, and/or claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure.

In the figures:

FIG. 9B is a timing diagram illustrating an example of the voltages across the switches S1 and S2 and diode D3 in the circuit of FIG. 5 during a turn-on transition of switch S1, according to aspects of the invention;

FIG. 9C is a timing diagram illustrating an example of capacitor voltage as a function of time for the circuit of FIG. 5 and method of FIG. 7, according to aspects of the invention;

DETAILED DESCRIPTION

Figure 1:
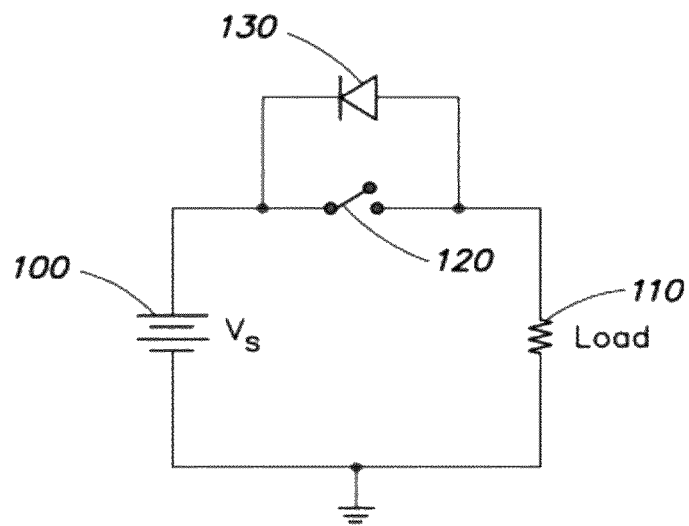
FIG. 1 is a diagram of a conventional switching topology.
Figure 3:
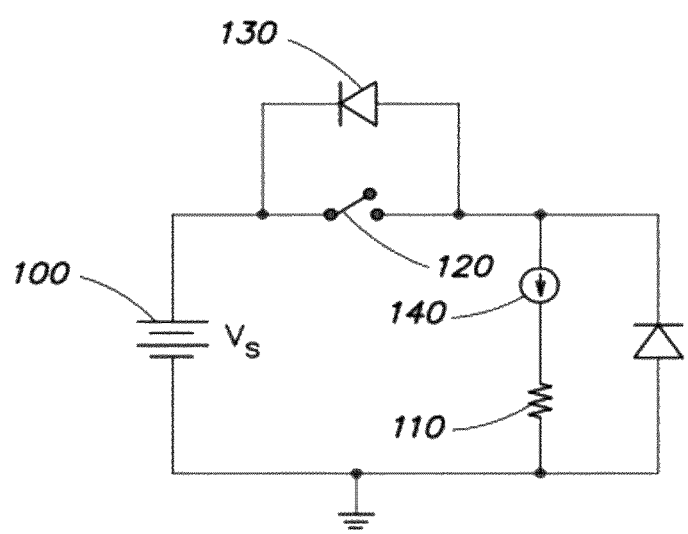
FIG. 3 is a diagram of another conventional switching topology.
Figure 2A:
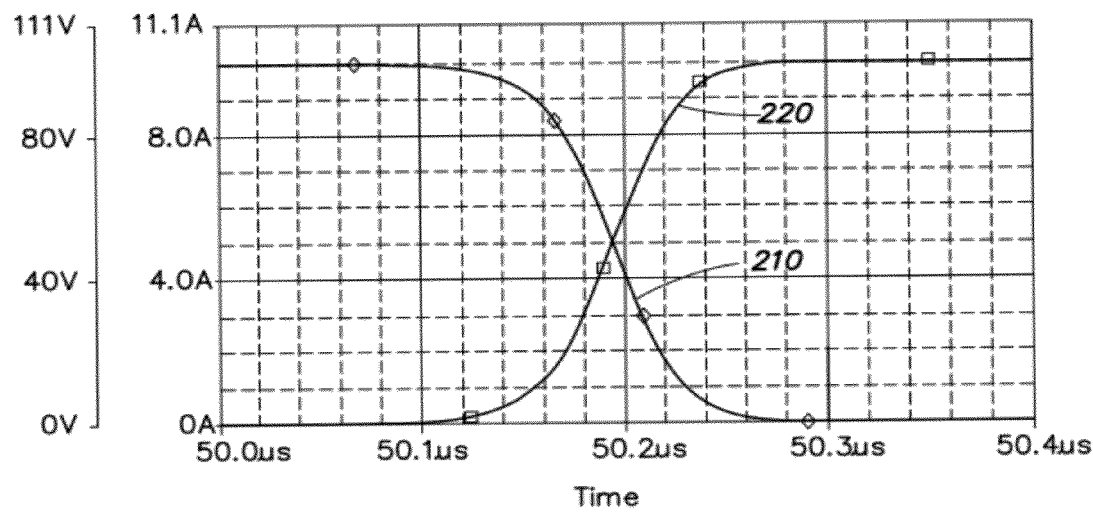
FIG. 2A is a graph of switch current and switch voltage (in Amps and Volts, respectively on the vertical axis) as a function of time (in microseconds along the horizontal axis) for the circuit of FIG. 1 during a turn-off transition of the switch.
Figure 2B:
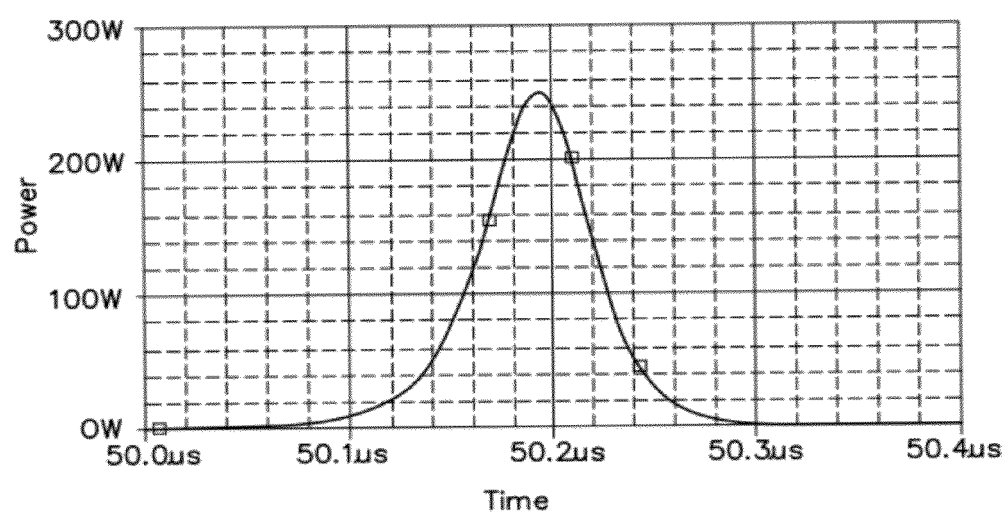
FIG. 2B is a graph of power loss in the switch (in Watts on the vertical axis) as a function of time (in microseconds along the horizontal axis), corresponding to the graph of FIG. 2A.
Figure 2C:
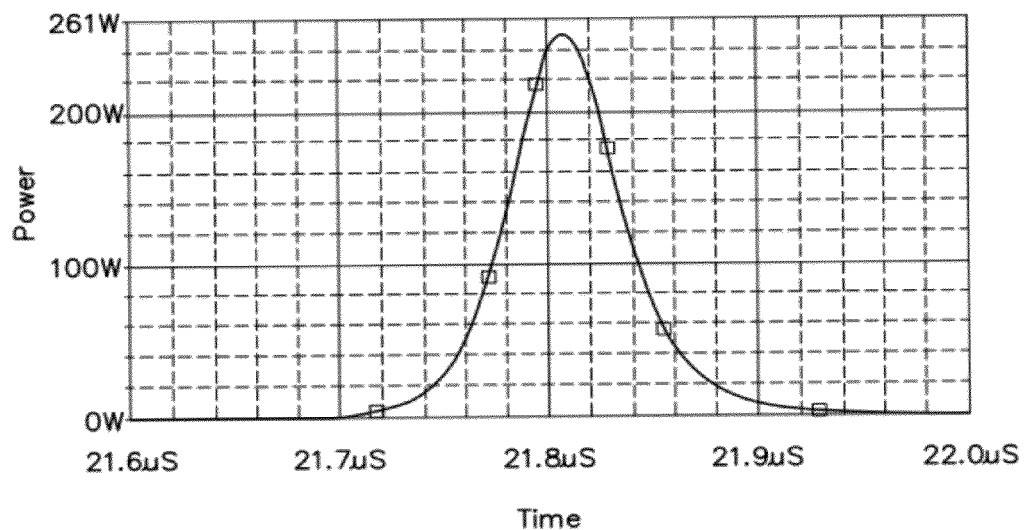
FIG. 2C is a graph of power loss in the switch (in Watts on the vertical axis) as a function of time (in microseconds along the horizontal axis), for the circuit of FIG. 1 during a turn-on transition of the switch.
Figure 2D:
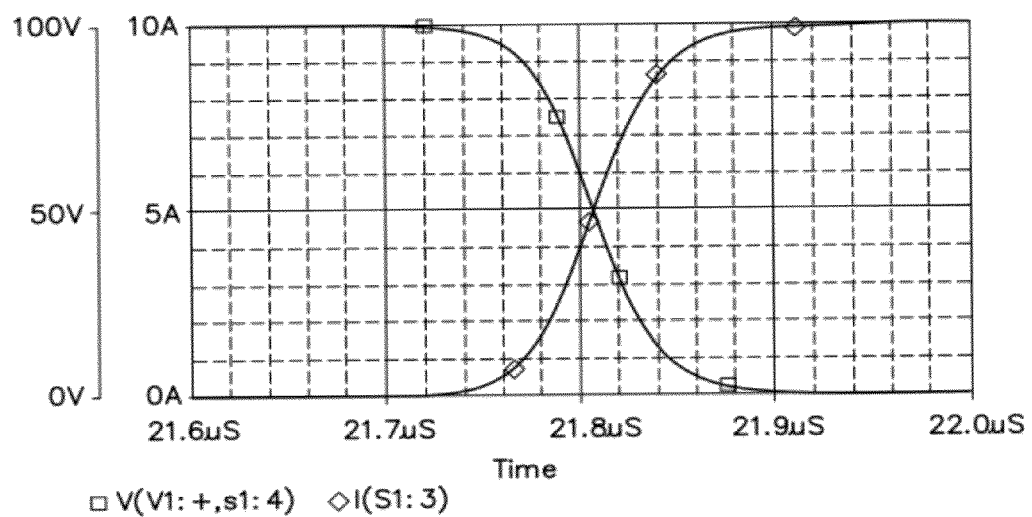
FIG. 2D is a corresponding graph of switch current and switch voltage (in Amps and Volts, respectively on the vertical axis) as a function of time (in microseconds along the horizontal axis) for the turn-on transition shown in FIG. 2C.
Figure 4A:
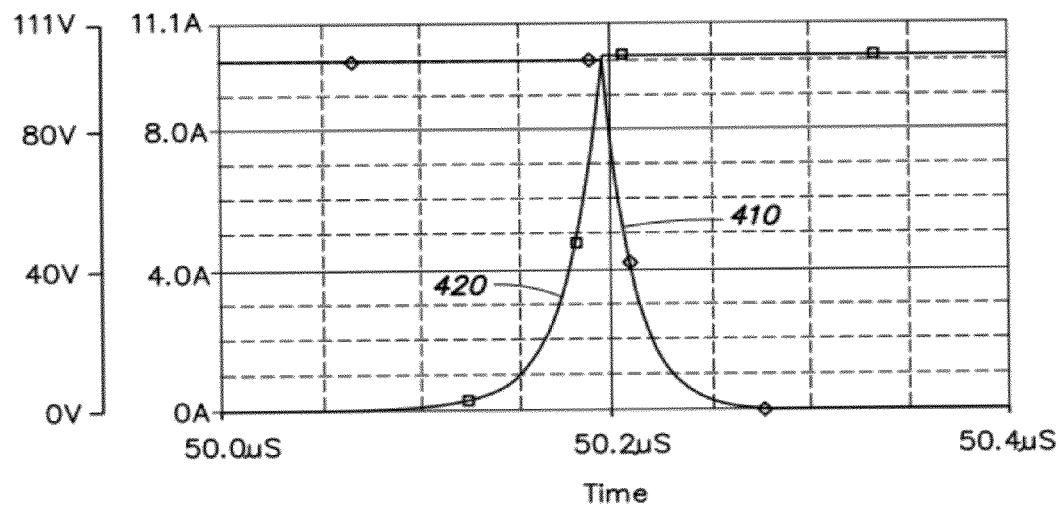
FIG. 4A is a graph of switch current and switch voltage (in Amps and Volts, respectively on the vertical axis) as a function of time (in microseconds along the horizontal axis) for the circuit of FIG. 3 during a turn-off transition of the switch.
Figure 4B:
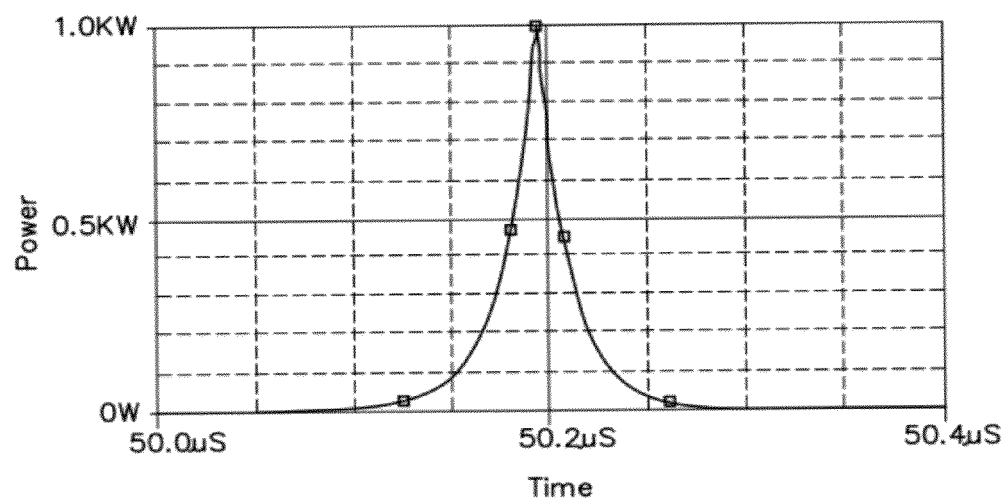
FIG. 4B is a graph of power loss in the switch (in Watts on the vertical axis) as a function of time (in microseconds along the horizontal axis), corresponding to the graph of FIG. 4A.
Figure 4C:
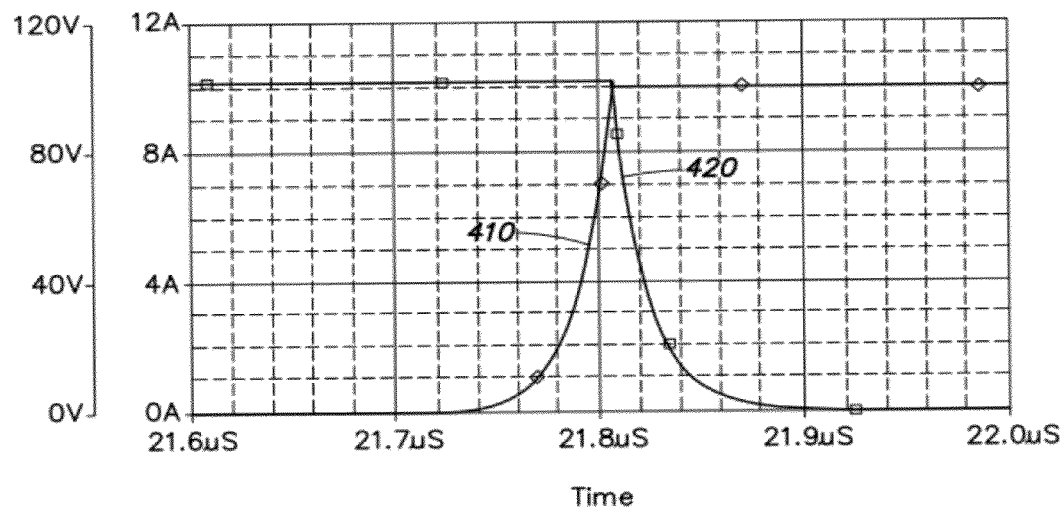
FIG. 4C is a graph of switch current and switch voltage (in Amps and Volts, respectively on the vertical axis) as a function of time (in microseconds along the horizontal axis) for the circuit of FIG. 3 during a turn-on transition of the switch.
Figure 4D:
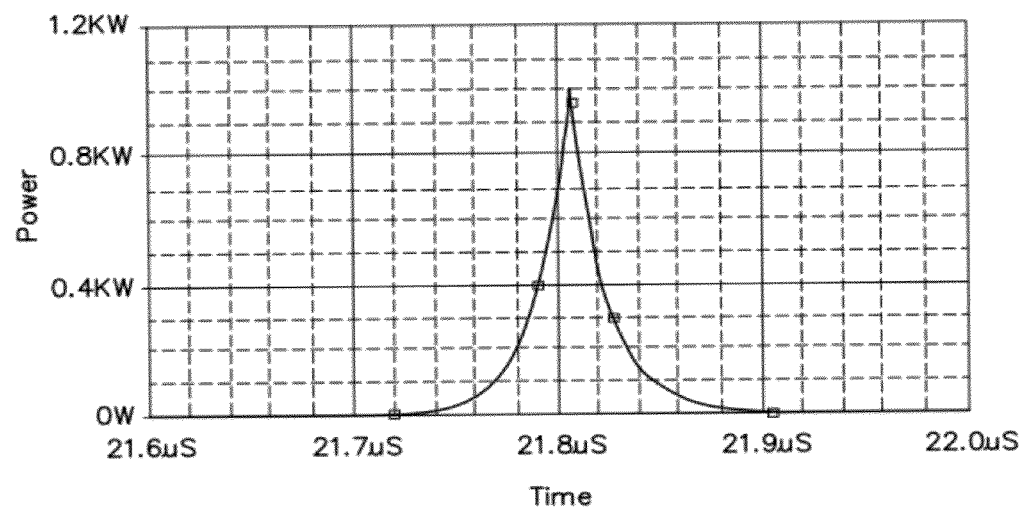
FIG. 4D is a graph of power loss in the switch (in Watts on the vertical axis) as a function of time (in microseconds along the horizontal axis), corresponding to the graph of FIG. 4C.

Aspects and embodiments are directed to a switching method and apparatus that may significantly reduce the switching losses experienced during turn-on and turn-off transitions of a switch. The switching topologies shown in FIGS. 1 and 3 are referred to as "hard" switches because there is significant overlapping current and voltage in the switch during the turn-on/turn-off transitions, as discussed above. Aspects and embodiments are directed to an apparatus that may be used to convert any hard switch topology into a "soft" switch in which there is little or no overlapping current and voltage, and which experiences greatly reduced switching losses. Embodiments of the technique discussed herein are universal and may be applied to a wide variety of switch topologies. Reducing switching losses may provide a number of benefits, including improving the switch efficiency and reducing or eliminating requirements for a heat sink on the switch. These benefits may be particularly advantageous in power converter applications and aerospace applications, where size, weight and efficiency may be critical design parameters.

It is to be appreciated that embodiments of the methods and apparatus discussed herein are not limited in application to the details of construction and the arrangement of components set forth in the following description or illustrated in the accompanying figures. The methods and apparatus are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods referred to herein in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 5:
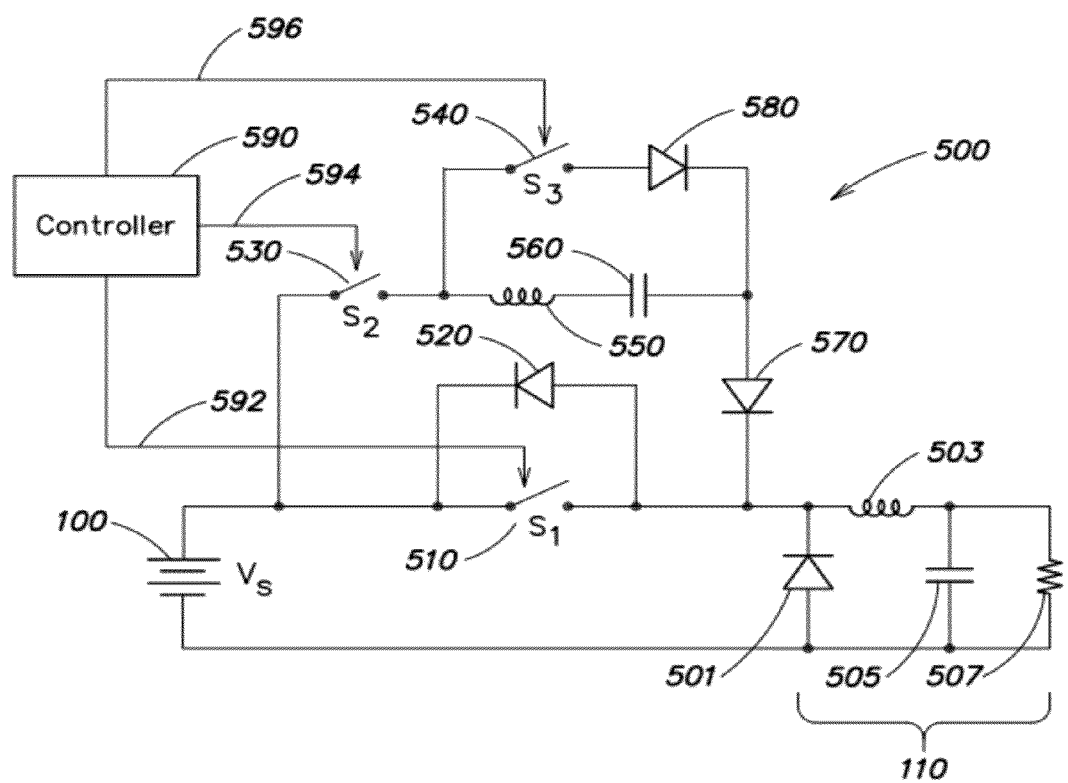
FIG. 5 is a schematic diagram of one example of system including a soft switching topology according to aspects of the invention.

Referring to FIG. 5, there is illustrated an example of a system incorporating a soft switching topology according to one embodiment. This topology is also referred to herein as a "zero voltage switch" (ZVS), as discussed further below. The circuit 500 includes a voltage source, or power source, 100 coupled to a load 110 comprising a diode 501, an inductor 503, a capacitor 505, and a resistor 507, via a switch 510 and diode 520. The switch 510 and diode 520 combination, also referred to as S1, is the primary switch where soft switching (and low loss switching) is to be achieved. It will be appreciated by those skilled in the art that although diode 520 and switch 510 are illustrated as separate components, the diode 520 may be integrated with the switch 510, and hence the combination of switch 510 and diode 520 is referred to herein as S1. The circuit 500 further comprises an arrangement of two auxiliary switches 530 (S2) and 540 (S3) and a resonant circuit including an inductor 550 and a capacitor 560, which is used to provide soft switching during turn-on and turn-off of the switch S1, as discussed further below. In one embodiment, diodes 570 (D2) and 580 (D3) are ultra fast diodes that have very small reverse recovery charges, that is, small charges in comparison to the minimum expected stored charge in the capacitor 560. Diode 570 acts as an isolator, preventing reverse charging of capacitor 560 through switch 530 (S2). Similarly, diode 580 acts as an isolator preventing reverse charging of the capacitor 560 through switch 540 (S3). The resonant elements, inductor 550 and capacitor 560, help to achieve substantially zero voltage across the main switch S1 during transitions, and also help to achieve soft switching for the auxiliary switches S2 and S3, as discussed further below. A controller 590 supplies control signals, on lines 592, 594 and 596, to the switches S1, S2 and S3, respectively, to turn the switches on and off.

Figure 6:
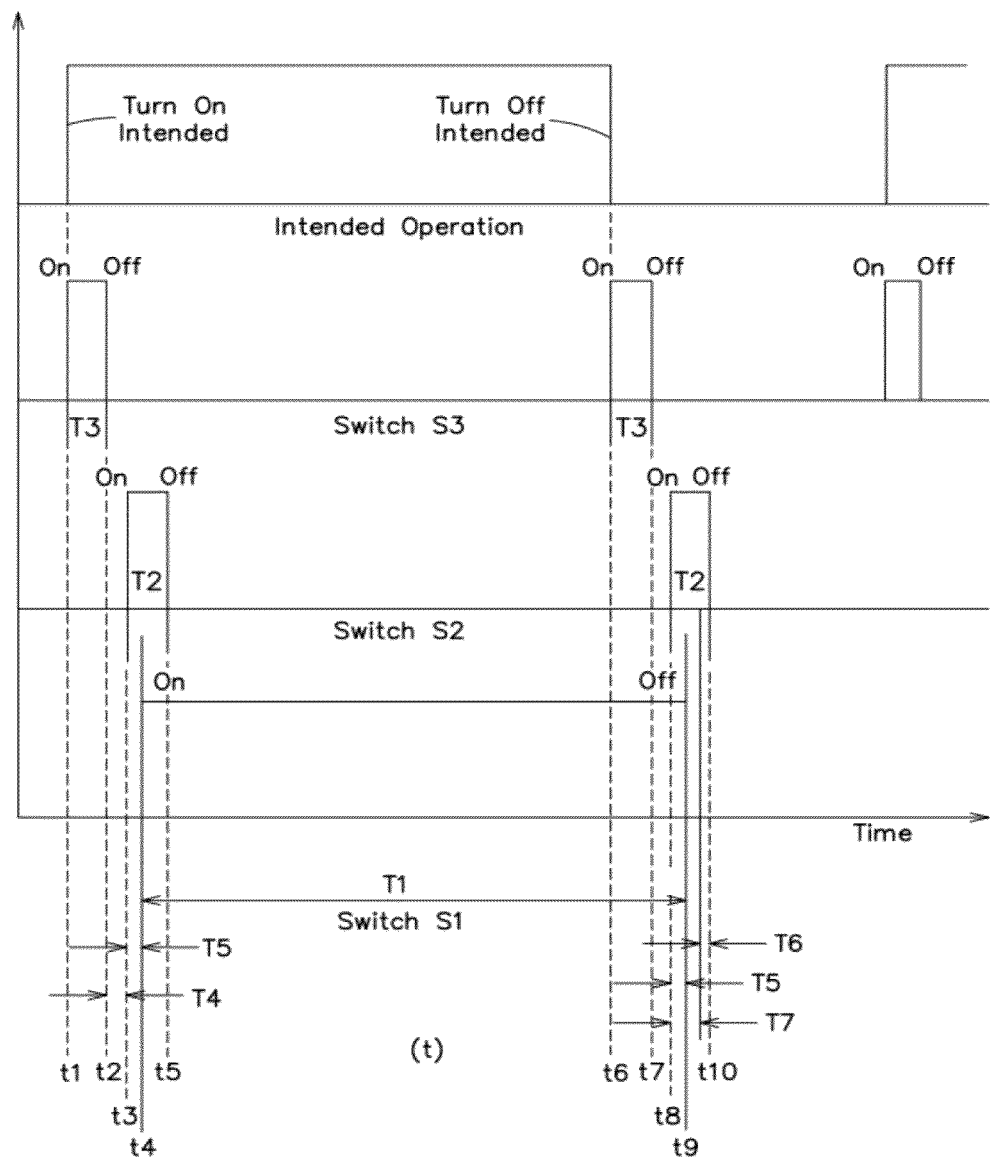
FIG. 6 is a timing diagram for one example of a soft switching technique according to aspects of the invention.
Figure 7:
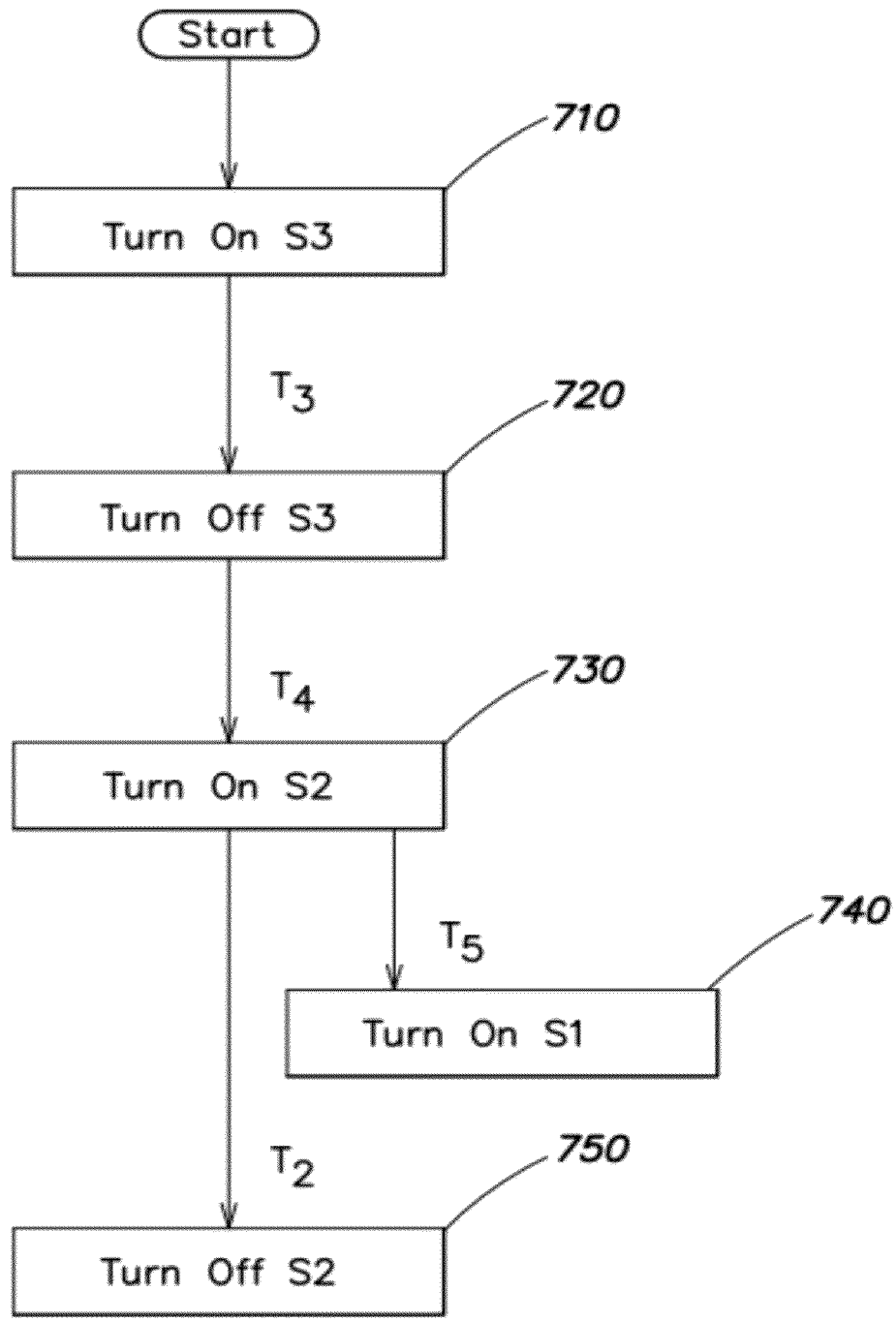
FIG. 7 is a flow diagram of one example of a method of soft switching for a turn-on transition, according to aspects of the invention.

Examples of operation of embodiments of the zero voltage switch of FIG. 5 will be discussed below with continuing reference to FIG. 6 and FIG. 7. FIG. 6 illustrates a timing diagram for one example of a soft switching methodology according to one embodiment, and FIG. 7 is a flow diagram of one example of a method of soft switching for a turn-on transition according to one embodiment.

Figure 8A:
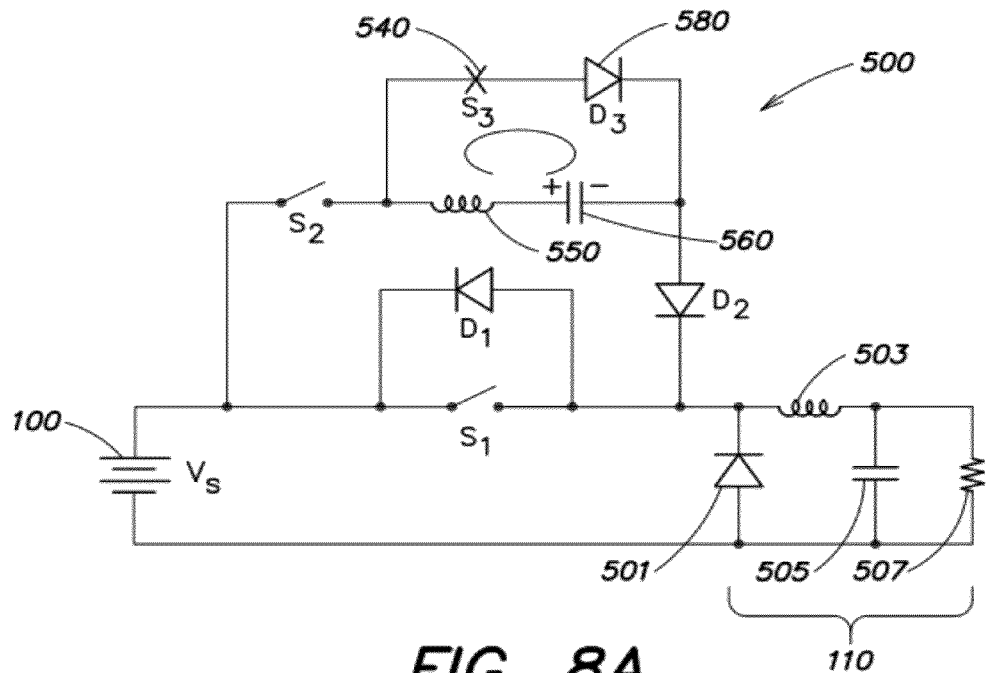
FIG. 8A is a schematic circuit diagram showing the switching topology of FIG. 5 in a first state during a soft switching procedure according to aspects of the invention.

For a turn-on transition of S1, the switch 510 is flipped from the off (or open) state, shown in FIG. 5, to the on (or closed) state. Accordingly, for the turn-on transition of S1, the initial state of the circuit 500 is as shown in FIG. 5, with switches S1, S2 and S3 all in the open (off) position. In FIG. 6, time t1 is the desired time at switch S1 is to be turned on. In one example, the switching circuit is part of a power converter, such as a buck converter, in which S1 is continually being switched on and off, and thus, the capacitor 560 is continually charging and discharging. Therefore, according to one embodiment, in order to achieve soft switching in switch S1, the polarity of the voltage across the capacitor 560 is reversed. Accordingly, at time t=t1, in step 710, the controller 590 sends a control signal on line 596 to close switch 540 (S3), and the circuit 500 enters "state 1" shown in FIG. 8A. The turn-on losses in switch 540 may be low because when the initial current in switch 540 is essentially zero since all the switches 510, 530 and 540 were open in the initial state.

However, there may be a dynamic impedance created during the turn-on transition of switch 540 that causes a small loss in switch 540.

Figure 9A:
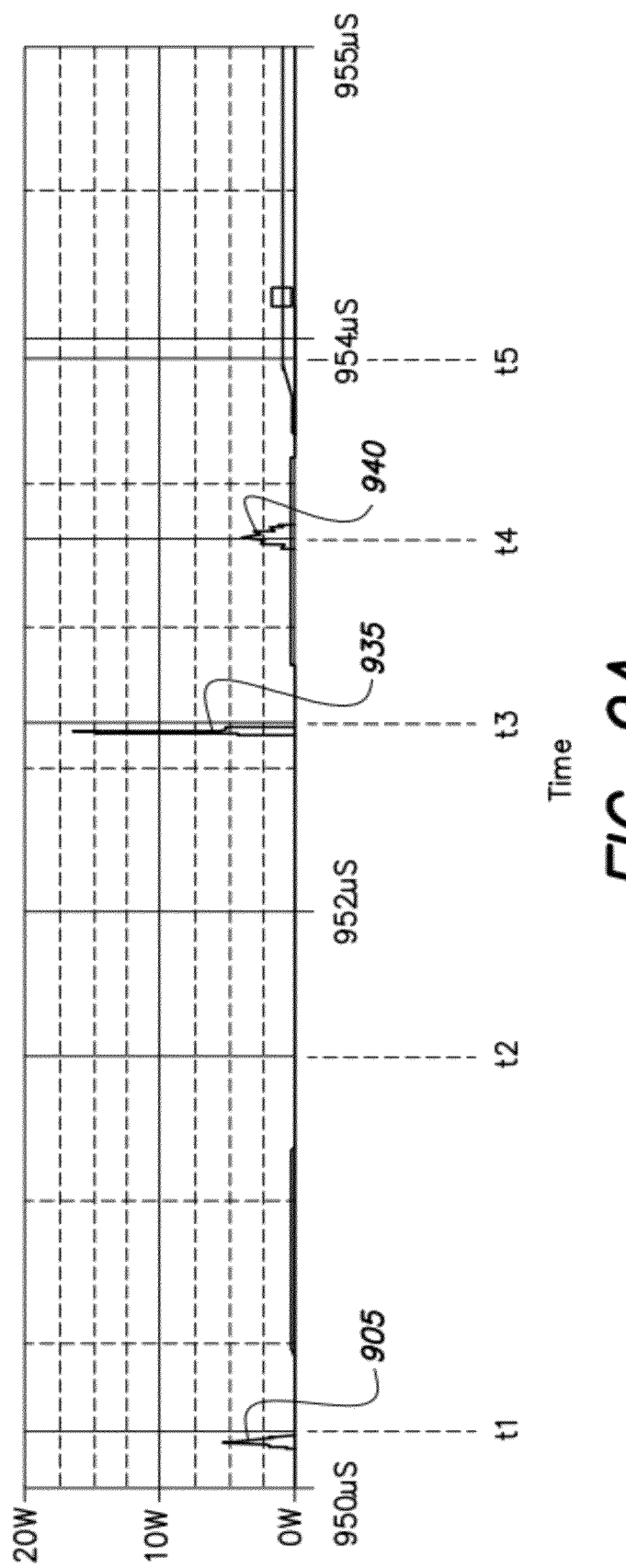
FIG. 9A is a timing diagram illustrating an example of power loss in the switches of the circuit of FIG. 5 during a turn-on transition of switch S1, according to aspects of the invention.

FIGS. 9A-9D are timing diagrams illustrating examples of the waveforms in the various components of circuit 500 during the turn-on transition of switch S1. FIG. 9A illustrates power loss (in Watts) in the switches 51, S2 and S3 as a function of time. In FIG. 9A, trace 905 is the power loss in switch 540 (S3), showing the loss discussed above. FIG. 9B illustrates the control voltages for switches S1 and S2 and S3 as a function of time. In FIG. 9B, trace 910 is the control voltage for switch S3, where positive polarity indicates that the corresponding switch is given a switch-on command and negative polarity indicates that the switch is given switch-off command. Any values in between positive and negative extremes indicate that there is a dynamic change in the impedance happening in the corresponding switch. It is to be appreciated that the sign (positive or negative) of the units plotted on the vertical axes in FIGS. 9A-9D indicate polarity and not absolute value.

Switch 540 remains closed for a duration T3 (from time t=t1 to time t=t2), as shown in FIG. 6, allowing the capacitor 560 to charge to the opposite polarity. This is illustrated in FIG. 9C, which shows the capacitor voltage (trace 915) as a function of time. In one example, the duration T3 for which the switch 540 is closed is calculated based on the capacitance and inductance values of the capacitor 560 and inductor 550, respectively, according to the equation:

$$T3 \geq \pi\sqrt{LC} \quad (1)$$

In equation (1), L is the inductance value of the inductor 550 and C is the capacitance value of the capacitor 560. During time duration T3, there may also be a conduction loss depending on the state of the impedance of the switch 540 and the voltage drop across the diode 580. However, these losses (the conduction loss and loss in switch 540 due to the dynamic impedance condition) are negligible compared to the total losses that would occur in the switch 510 during a conventional hard-switched turn-on transition.

Figure 8B:
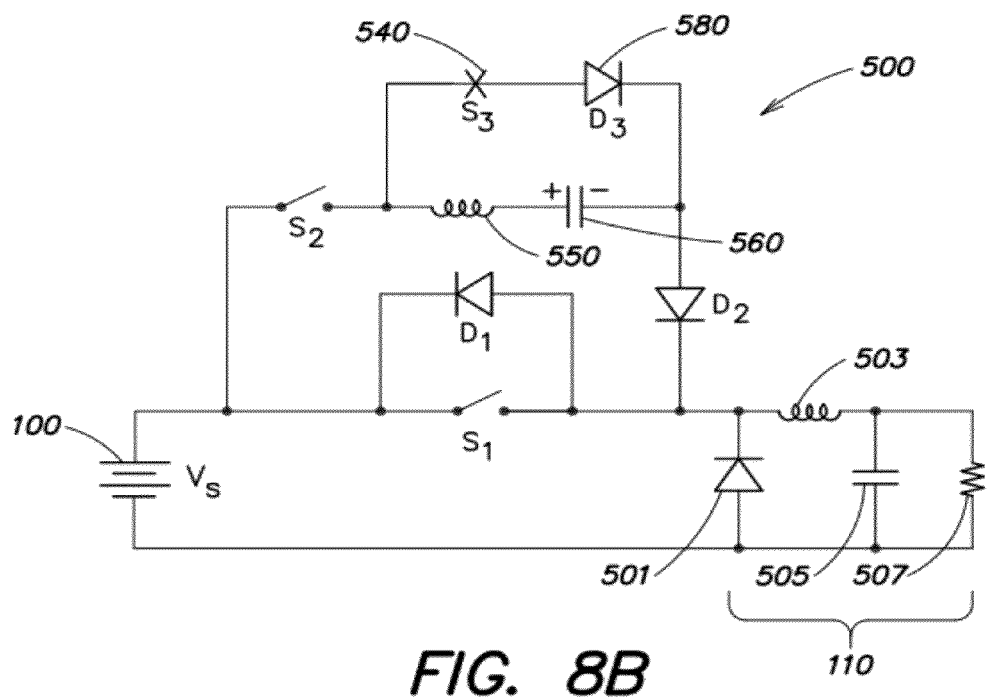
FIG. 8B is a schematic circuit diagram showing the switching topology of FIG. 5 in a second state during a soft switching procedure according to aspects of the invention.
Figure 9D:
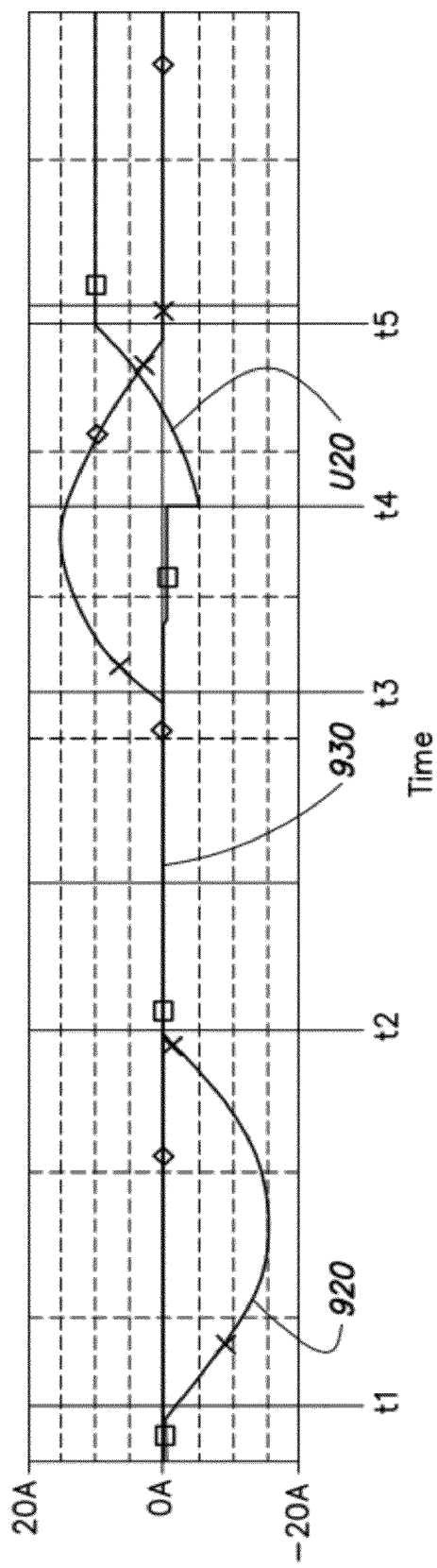
FIG. 9D is a timing diagram illustrating an example of currents in the circuit of FIG. 5 during a turn-on transition of switch S1, according to aspects of the invention.
Figure 10:
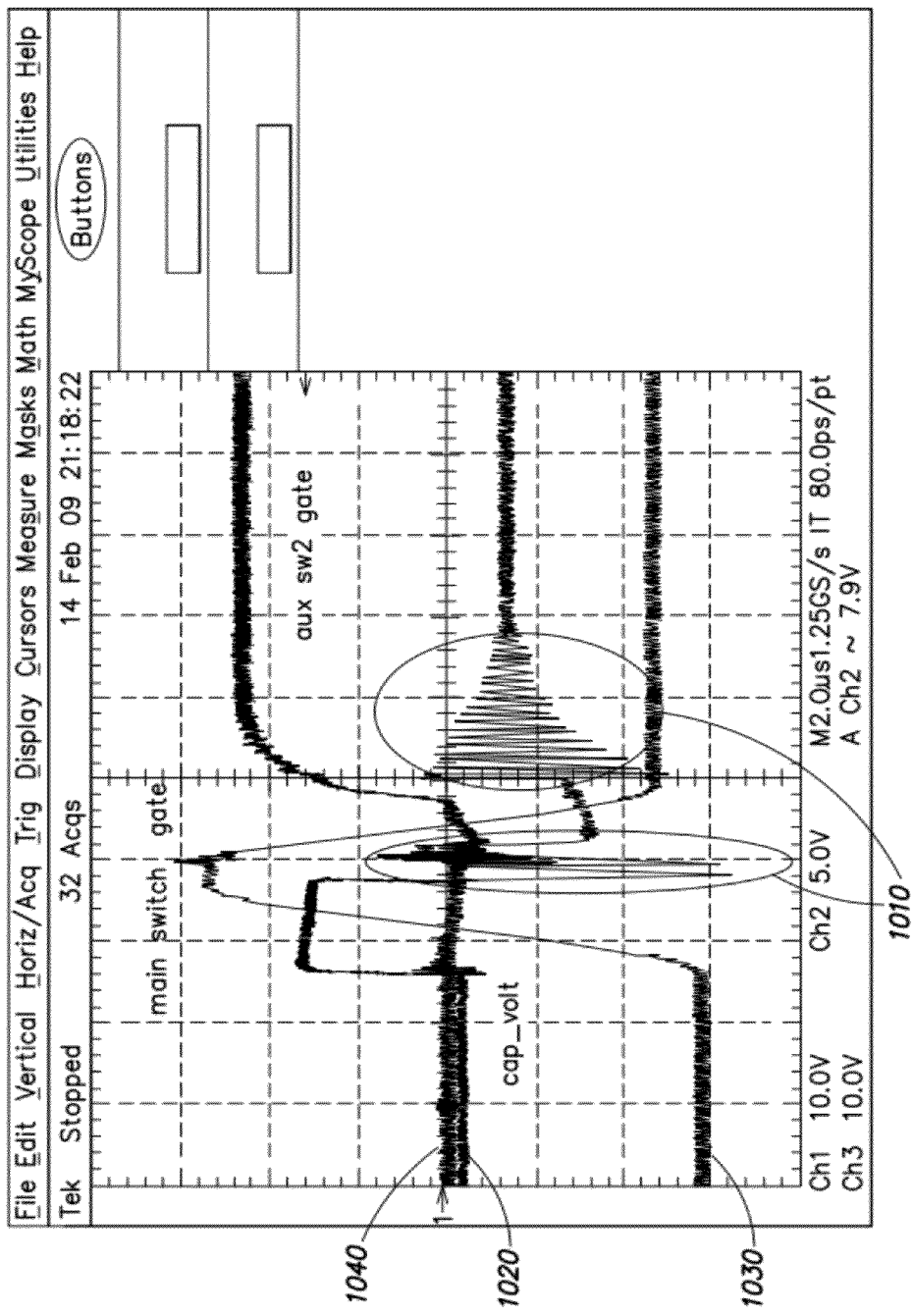
FIG. 10 is a screen shot of a measurement device illustrating example measured signals in a circuit such as that illustrated in FIG. 5, according to aspects of the invention.

Toward the end of time period T3, the voltage across capacitor 560 becomes completely reversed, as shown at time t2 in FIG. 9C, and the circuit 500 enters "state 2" shown in FIG. 8B. During the time from t1 to t2 in FIG. 9C, the capacitor voltage reverses. The trace 920 in FIG. 9D indicates current through diode 580 which is essentially the same as the current through switch 540. The trace 930 in FIG. 9D indicates current though diode 570 which is essentially the same as the current through the switch 530. The trace U20 in FIG. 9D indicates current through the switch 510. In one example, since the current in the resonant tank formed with the capacitor 560 and inductor 550 is practically zero when the polarity of the capacitor 560 has reversed, if switch 540 remains closed, as shown in FIG. 8B, the voltage across the inductor 550 may resonate with the junction capacitance of diode 580, various stray inductances and the primary resonant inductor 550; however this is a harmless oscillation. If switch 540 is opened in this condition, the resonance may take place with the output capacitance of switch 540. This may occur at time t=t2, when switch 540 is opened. Depending on the frequency of the oscillation, the oscillation may influence the gate signal through miller capacitance. An example of this effect is illustrated in FIG. 10, which shows oscillations 1010 reflected at the gate of switch 540 through miller capacitance due to parasitic components. In FIG. 10, trace 1020 is the signal at the gate of switch 540, trace 1030 is the voltage across capacitor 560, and trace 1040 is the signal at the gate of switch 510. Accordingly, to avoid the reflected oscillations 1010, it may be important to minimize the parasitic effects in the circuit path made up of the inductor 550, the capacitor 560, switch 540 and diode 580.

According to one embodiment, the minimization of the parasitic effect can be qualitatively analyzed by taking various Kirchhoff's voltage loops involved in the system to the s-domain. For example, the loop to be considered for analysis in the case of resonance under consideration is the loop comprising the resonant inductor 550, the resonant capacitor 560, diode 580 and switch 540. The resonance can be explained as effect of the complex conjugate poles consisting predominantly of the resonant inductor 550 (plus various trace inductances depending on magnitude) and the junction capacitance of the diode 580 in the impedance transfer function for the loop. The transient source for the resonance is initiated by sudden collapse of voltage across the resonant inductor 550. This is caused by the non-availability of time rate of change of current through the inductor 550 due to commuting diode 580. When the switch 540 is opened, the resonant oscillations that is set in by the junction capacitance of diode 580 and resonant inductor 550 continues to resonate at a different frequency and amplitude depending on the resultant complex conjugate poles consisting predominantly of resonant inductor 550, the junction capacitance of the diode 580 and the output capacitance of the switch 540. Any parametric adjustments that change the location of these poles to move them further away from the imaginary axis in the left half of the s-plane, bring them closer to the real axis, or move them on the real axis, will minimize or eliminate the parasitic effects.

In one example implementation, a high value resistor across diode 580 helped in bringing the complex conjugate pairs closer to real axis there by reducing oscillation. Actual power loss in the resistor was negligible. In one example, the value of the resistor was on the order of about 10 kiloOhm for a junction capacitance of approximately 20 pF and resonant inductor of 16 uH. In a another example, a switch with a higher on-state resistance may be selected for switch 540; however this carries the risk of moving the location of complex conjugate pairs that are created by resonant inductor 550 and resonant capacitor 560 in the s-plane during normal operation. Accordingly, in at least some implementations, it may be preferable to use the first example.

In addition, in one embodiment, during the design of the circuit, it may be necessary to consider all loops that could be impacted by a impulse voltage across the resonant inductor for each of the transient time instances t1 to t10 as depicted in FIG. 6. In one embodiment, the objective of the analysis is to push the complex conjugate pole pairs in the impedance transfer function due to parasitic effects is well into the left half of the s-plane, or close to or on the real axis, such that the quality of parasitic resonance is poor, while not compromising the quality of the resonance made by resonant capacitor 560 and resonant inductor 550. In one example, quality is defined as the ratio of peak energy stored in energy storing elements to the energy dissipated while the impedance oscillates as a response to impulse.

Figure 8C:
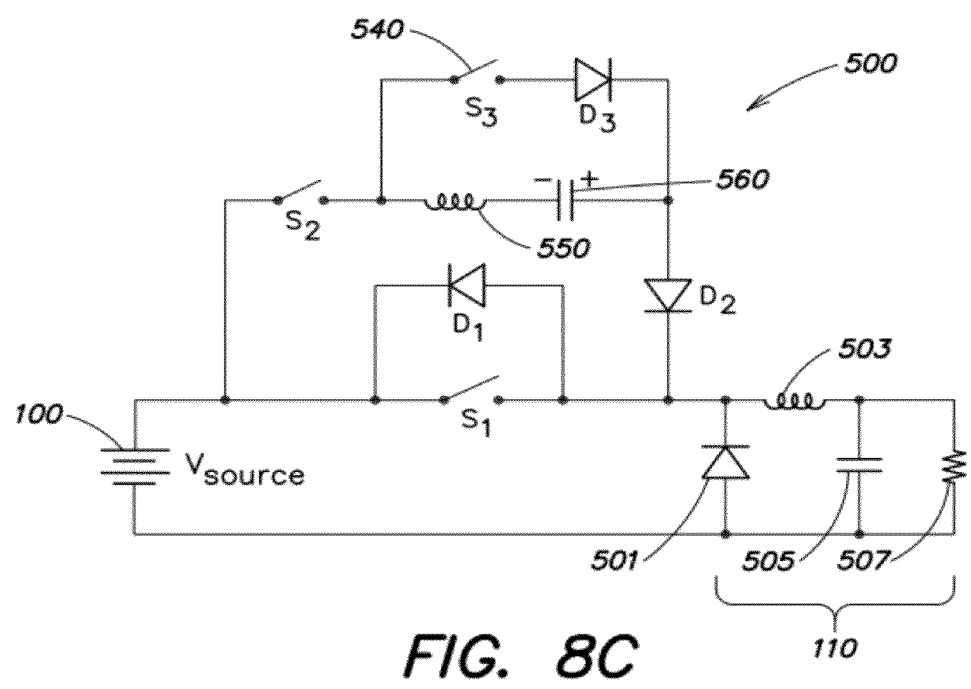
FIG. 8C is a schematic circuit diagram showing the switching topology of FIG. 5 in a third state during a soft switching procedure according to aspects of the invention.

Referring to FIGS. 6 and 7, at time t=t2, switch 540 is opened again (step 720) responsive to a signal from the controller 590, and the circuit 500 enters the state ("state 3") shown in FIG. 8C. As shown in FIG. 8C, in this state, the polarity of the capacitor 560 has been reversed. In one example, state 3 is "dead time" for the circuit 500, occurring between time t=t2 and time t=t3 in FIG. 6, and between the turn-off of switch S3 (at t=t2) and turn-on of switch S2 (at t=t3). This dead time of state 3 has a duration T4, and is used to prevent significant overlap of the turn-on of switch S2 and S3, which can potentially create a hard switched condition by taking the path of closed switch 530, closed switch 540, diode 580 and diode 570, and thereby avoiding the switching losses.

Figure 8D:
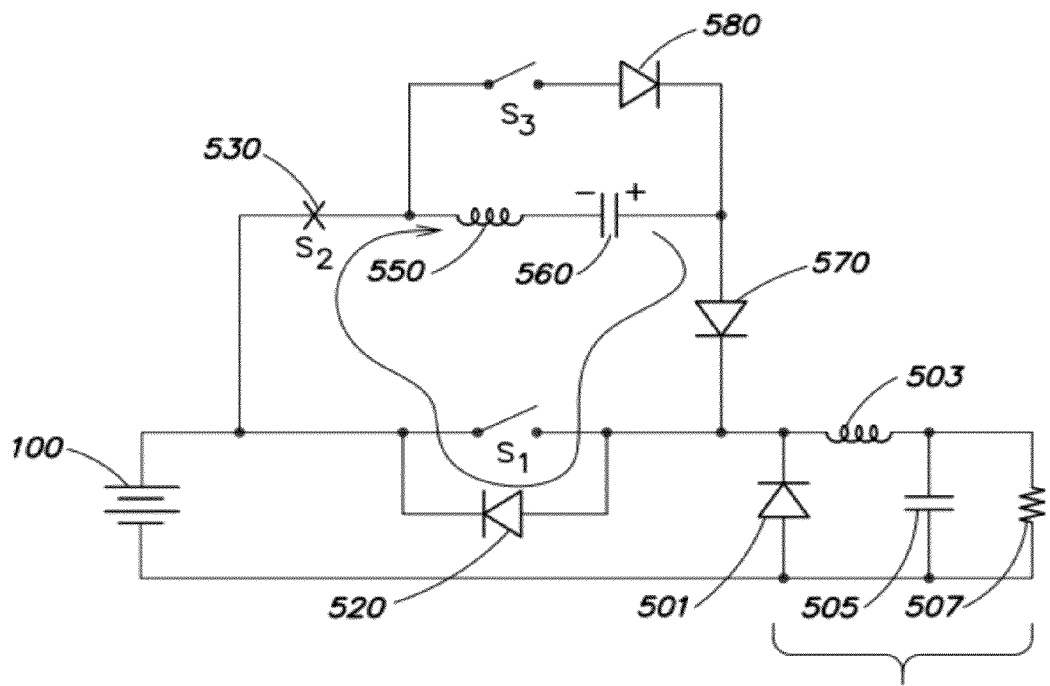
FIG. 8D is a schematic circuit diagram showing the switching topology of FIG. 5 in a fourth state during a soft switching procedure according to aspects of the invention.

At time t=t3, switch 530 (S2) is closed (turned on) by the controller 590, step 730, to start pushing current into diode 570 (D2), and the circuit enters "state 4" shown in FIG. 8D. When the switch 530 is turned on, a path is formed with the voltage source 100, closed switch 530 (S2), the inductor 550, the capacitor 560, the load inductor 503, the load capacitor 505 and the load resistor 507. The capacitor voltage (trace 915) begins to decrease toward zero, as shown in FIG. 9C, and the current in the inductor 550 (trace 920) begins to rise, as shown in FIG. 9D. In one example, at time t=t3, the voltage across the switch 530 is essentially zero. In addition, the inductor 550 prevents fast rise of the current through the switch 530. Referring to FIG. 9D, trace 930 represents the current through the switch 530, which, from time t3 to time t5 can be seen to essentially match the current through the inductor 550 (trace 920). Thus the switch 530 soft switches during its turn-on transition, with relatively low loss. In FIG. 9A, trace 935 represents the loss in switch 530 (S2). Since the load consisting of the load inductor 503, the load capacitor 505 and the load resistor 507 has current source characteristics, the diode 520 will not forward bias until the resonant current exceeds the load current (that is, the current that S1 would carry after completion of the turn-on process).

As discussed above, in state 4, the voltage across the capacitor 560 decreases as shown in FIG. 9C. Accordingly, after a certain time has elapsed with the circuit 500 in state 4, the zero crossing of the voltage across the capacitor 560 will occur, such that switch 510 can be closed (at time t=t4). Allowing the resonant capacitor voltage to drop to zero before turning on the switch 510 may ensure that the voltage across the switch is close to zero when the switch closes, thereby achieving soft switching. Referring to FIG. 6, the duration between the turn-on of switch S2 (at t=t3) and the turn-on of switch S1 (at t=t4) is T5. In one example, T5 is ¼/*Tr, where Tr is the resonant time period of the tank circuit made up of the capacitor 560 and inductor 550.

Figure 8E:
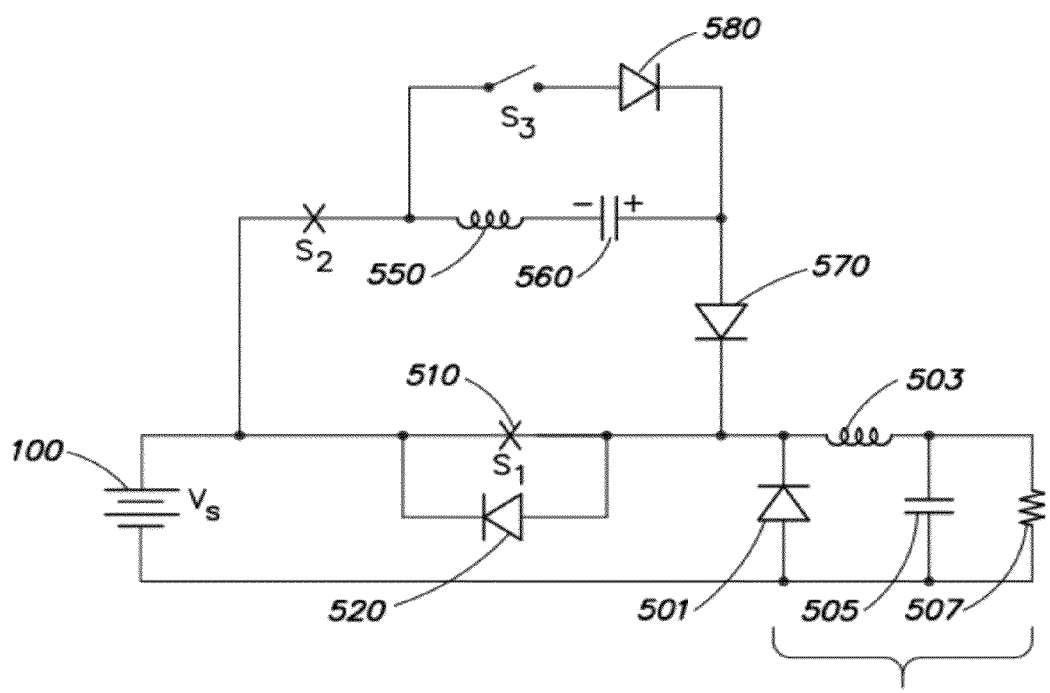
FIG. 8E is a schematic circuit diagram showing the circuit of FIG. 5 in a fifth state during a soft switching procedure according to aspects of the invention.
Figure 11A:
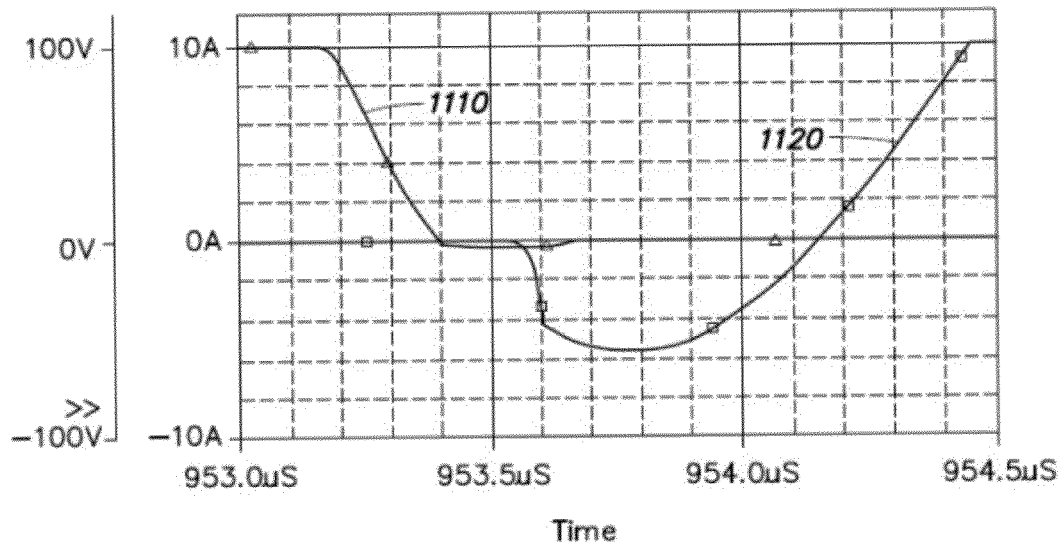
FIG. 11A is a graph of current and switch voltage (in Amps and Volts, respectively on the vertical axis) in switch S1 as a function of time (in microseconds along the horizontal axis) for the circuit of FIG. 5 during a turn-on transition of the switch S1.
Figure 11B:
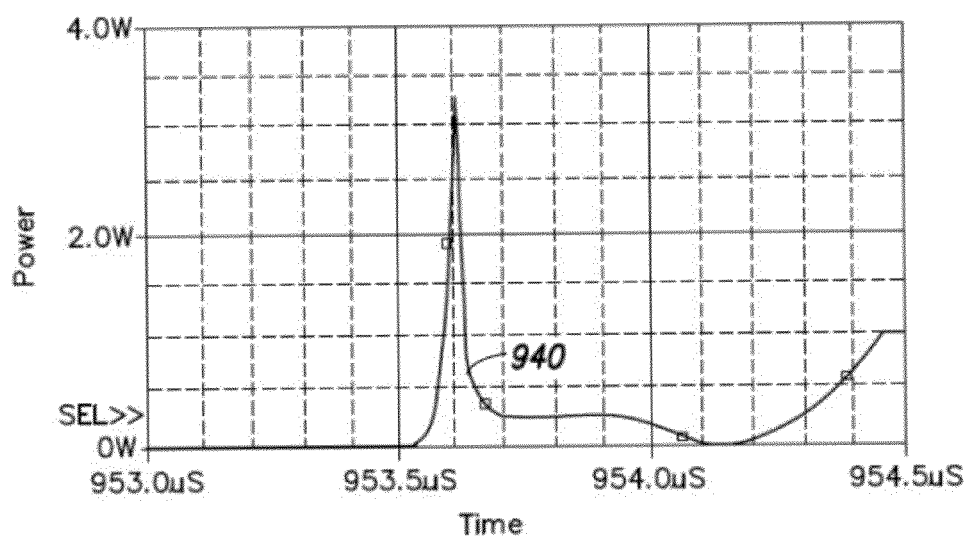
FIG. 11B is a graph of power loss in the switch S1 (in Watts on the vertical axis) as a function of time (in microseconds along the horizontal axis), corresponding to the graph of FIG. 11A.

At time t=t4, the controller 590 sends a control signal on line 592 to close the main switch 510 (step 740), and the circuit 500 enters "state 5" as shown in FIG. 8E. Referring to FIGS. 9C and 9D, at time t=t4, the capacitor voltage (trace 915) is approximately zero and the resonant current (trace 930) peaks. Thus, since to forward bias the diode 520, the resonant current exceeds the load current, as discussed above, and the resonant current is at a peak at time t=t4, the voltage across the switch 510 is approximately zero, and switch 51 may be turned on at t4 with little or no loss. Thus, when the switch 510 is closed at time t=t4, and the current through the switch begins to rise, there is little or no voltage across the switch. This is shown in FIG. 11A, which illustrates a graph of switch voltage (trace 1110) and switch current (trace 1120) as a function of time for an example of a ZVS (zero voltage switching) switch topology, such as circuit 500, during a turn-on transition. As a result, the power loss in the switch S1 during the current-voltage overlap period in the switch is significantly lower. For example, FIG. 11B illustrates the power loss (trace 940) in the switch S1 as a function of time, corresponding to the voltage and current plots shown in FIG. 11A. This power loss is also shown in FIG. 9A (trace 940). As can be seen in FIG. 11B, the power loss during the overlap period is only about 3.5 W, compared to the 250 W or 1 kW losses experienced using the hard switching topologies of FIGS. 1 and 3. Thus, using an embodiment of the circuit 500, soft switching with low losses can be achieved in switch 510 (S1).

In one example, the minimum time for which switch S1 is required to be turned on or turned off for effective soft switching is a function of the resonant time period of circuit formed by the capacitor 560 and inductor 550. Thus, in one example, a minimum time for which switch S1 should be kept turned on and off is given by:

$$T1(min)=2\pi\sqrt{LC} \tag{1A}$$

The minimum time lag between operation of switch S3 and switch S2 is given by:

$$T5(min)=\pi/2\sqrt{LC} \tag{1B}$$

Using the ZVS switch may cause a minimum delay given as $(3\pi/2)\sqrt{LC}$ in the switching process relative to a hard switching topology. For example, referring to FIG. 11A, it can be seen that the turn-on switching process takes approximately 1.3 microseconds (μs) to complete (from about 953.15 μs to 954.45 μs on the time axis). This delay is also shown in FIG. 6, as the difference between t1, the point at which the switch S1 is to be turned on, and t4, when switch S1 is actually turned on. In addition, the maximum frequency achievable is limited to $\frac{1}{4}\pi\sqrt{LC}$. This delay and operating frequency limitation, however, may be a relatively small price to pay for the greatly reduced switching losses that may be achieved using the ZVS switch.

According to one embodiment, the turn-on process for switch S1 is completed by turning off switch S2 (step 750) once switch S1 has been turned on. It may be important not to keep the switch 530 closed for too long a duration as it may cause a parasitic component oscillation, with the inductor 550 supplying the oscillation source voltage, when the current drops to zero in the resonant tank formed by the inductor 550 and the capacitor 560. The energy involved in the oscillations may be very low, but if the oscillation frequency matches the characteristic impedance of component leads present in the circuit 500, it may cause radiated emissions, which would be undesirable. Accordingly, as shown in FIG. 6, switch 530 (S2) may remain closed for a duration T2, allowing sufficient time for the switch 510 (S1) to be turned on, and then be turned off at time t=t5. At time t=t5, the circuit 500 enters a steady state, shown in FIG. 8F, and the turn-on process for switch S1 is complete. The switch S1 may remain on for a time period T1, as shown in FIG. 6.

Figure 12:
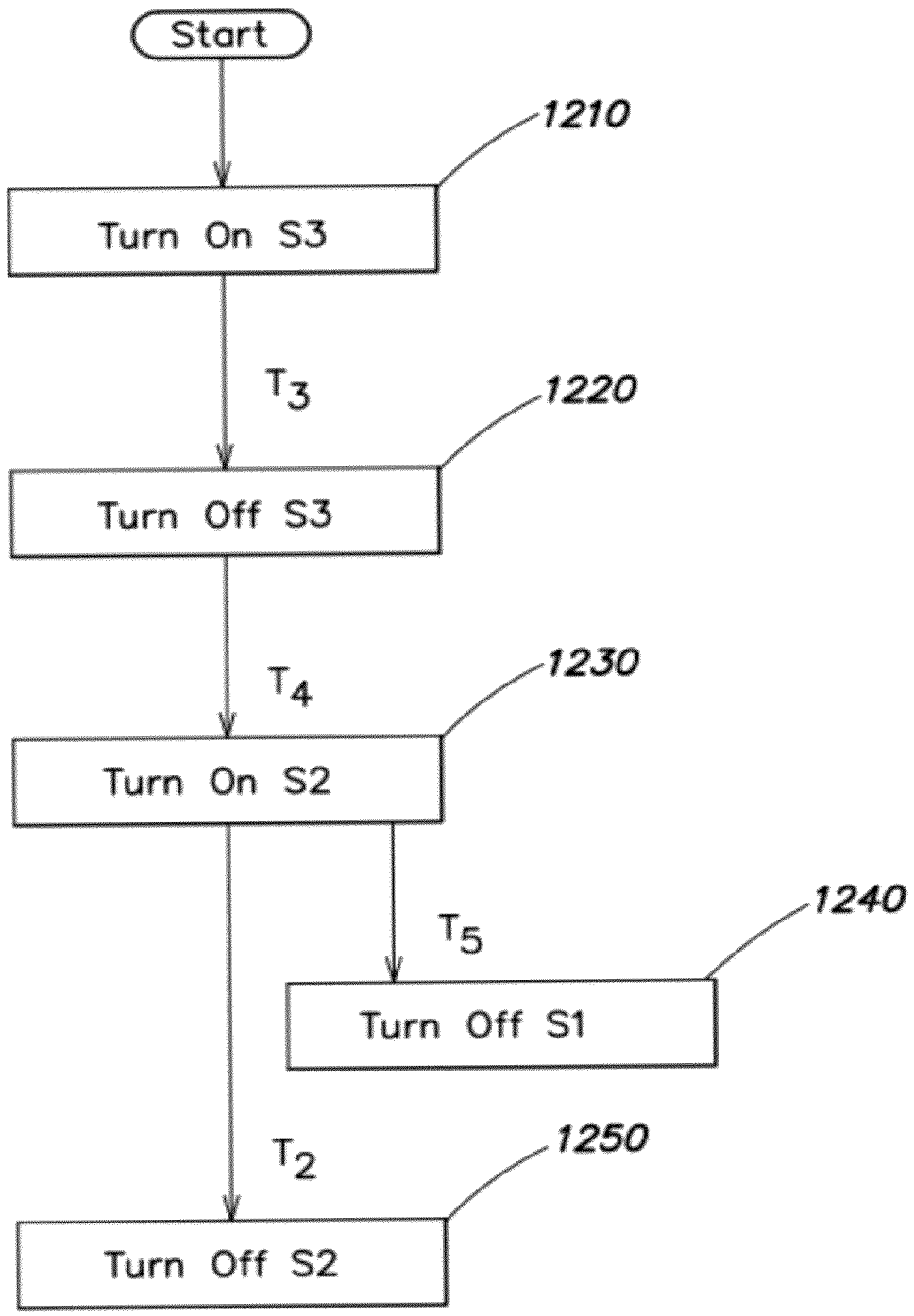
FIG. 12 is a flow diagram of one example of a method of soft switching for a turn-off transition, according to aspects of the invention.

According to one embodiment, a similar process may be used to achieve soft switching for a turn-off transition for the switch S1 using the same (or a similar) circuit 500. FIG. 12 illustrates one example of a method of soft switching for a turn-off transition of switch S1. In addition, FIGS. 14A-14C are timing diagrams illustrating examples of the waveforms in the various components of circuit 500 during the turn-off transition of switch S1. Examples of a method of soft switching for a turn-off transition are discussed below with continuing reference to FIG. 6, FIG. 12, FIGS. 13A-13D and FIGS. 14A-14C.

Figure 8F:
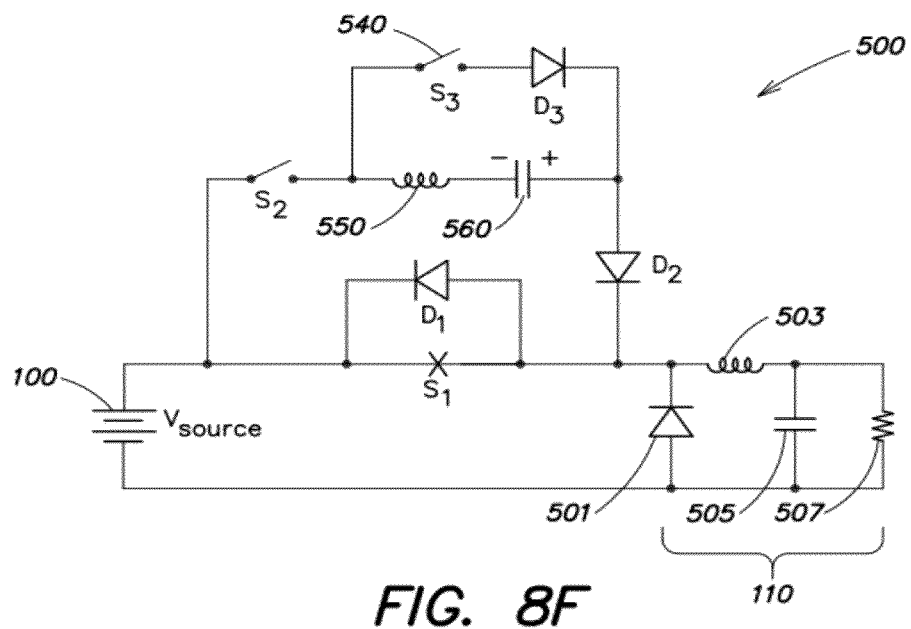
FIG. 8F is a schematic circuit diagram showing the circuit of FIG. 5 in a steady state at and after completion of a turn-on transition of the switch and prior to a turn-off transition of the switch.

For a turn-off transition, the circuit 500 is initially in the state shown in FIG. 8F, with switch S1 closed, and switches S2 and S3, 530 and 540, respectively, open. Referring to FIG. 6, time t=t6 is the desired time at switch S1 is to be turned off. Accordingly, at t6, the switch 540 (S3) is turned on (step 1210) by the controller 590 to reverse the polarity of the capacitor 560, as discussed above. The circuit 500 enters the state shown in FIG. 13A. During the time from t6 to t7, the voltage across the capacitor 560 reverses polarity, as shown in FIG. 14A in which trace 1410 is the capacitor voltage. Switch 540 remains on for a duration T3 to allow the capacitor voltage to reverse polarity. Referring to FIG. 14B, in which trace 1420 is the inductor current, as the voltage in the capacitor 560 changes polarity, the current in the inductor 550 increases, reaching a peak at the time of the zero-crossing of the capacitor voltage, and decreases again to approximately zero when the capacitor voltage peaks in the opposite polarity. Once the capacitor 560 has completely reversed polarity, at time t7, the switch 540 can be opened (turned off) again (step 1220), and the circuit 500 enters the state shown in FIG. 13B. As discussed above, there is a "dead time" between time t=t7 when switch 540 (S3) is turned off and time t=t8, when the switch 530 (S2) is switched, during which the circuit is in the state shown in FIG. 13B, to reduce switching losses in the switches S2 and S3. FIG. 14C is a timing diagram illustrating an example of power loss in the switches during the turn-off transition of switch S1, in which trace 1430 represents the power loss in switch S3, trace 1440 represents the power loss in switch S2, and trace 1450 represents the power loss in switch S1. As shown in FIG. 14C, there is a small loss of fewer than 5 Watts in each of switches S3 and S2 during their transitions at times t6 and t8, respectively.

At time t=t8, switch 530 (S2) is closed (turned on) responsive to a signal from the controller 590 to force a current through the switch 530 (step 1230). As a result, the net current through the switch S1 decreases to the difference between the resonant current, through the inductor 550 and capacitor 560, and the steady state current through the switch S1. This is illustrated in FIG. 14B, in which trace 1460 represents the current through the switch S1. During the same time period, from time t8 to time t9, the current through the switch S2 (trace 1470) substantially matches the resonant current in the inductor 550 (trace 1420) and increases to a peak at time t9. As shown in FIG. 14A, during the same time period, the capacitor voltage decreases to substantially zero at time t9. In one example, when the circuit 500 is in the state shown in FIG. 13C, it is in a resonant mode of the resonant tank formed by the inductor 550 and capacitor 560 through closed switches S1 510, S2 530 and diode 570.

Figure 13A:
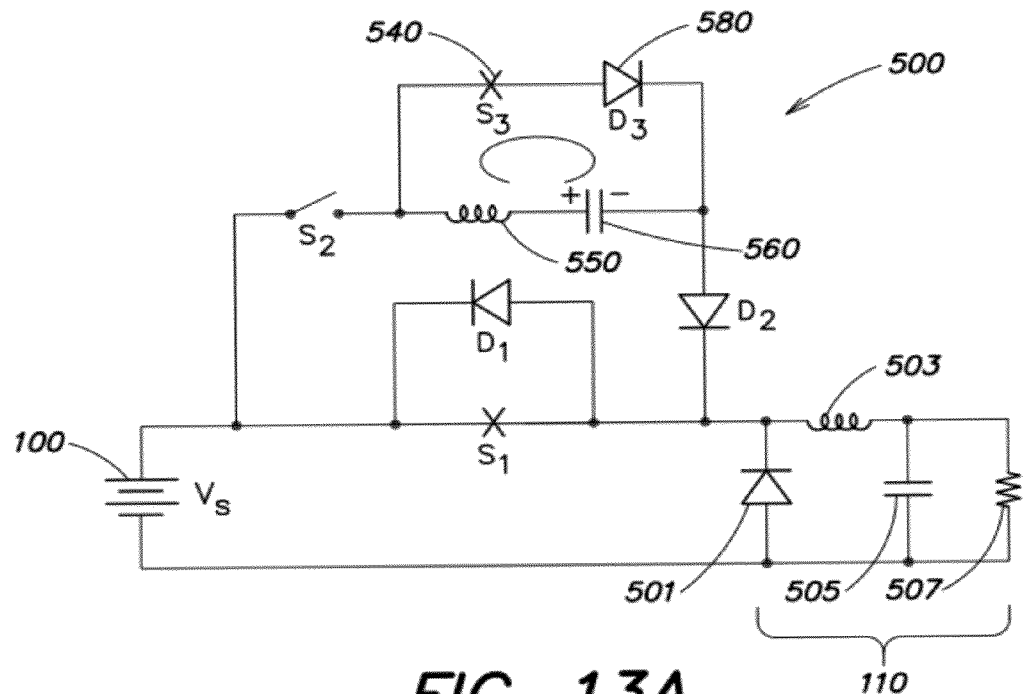
FIG. 13A is a schematic circuit diagram showing the switching circuit of FIG. 5 in a first state during a soft switching procedure for a turn-off transition, according to aspects of the invention.
Figure 13B:
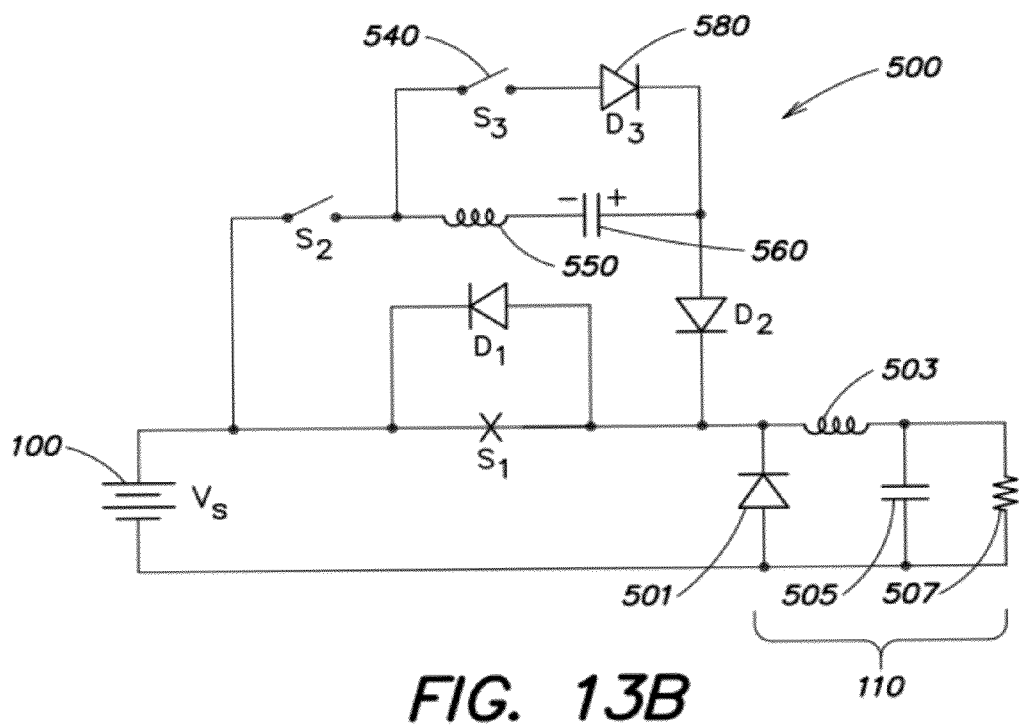
FIG. 13B is a schematic circuit diagram showing the switching topology of FIG. 5 in a second state during the soft switching procedure for a turn-off transition, according to aspects of the invention.
Figure 13C:
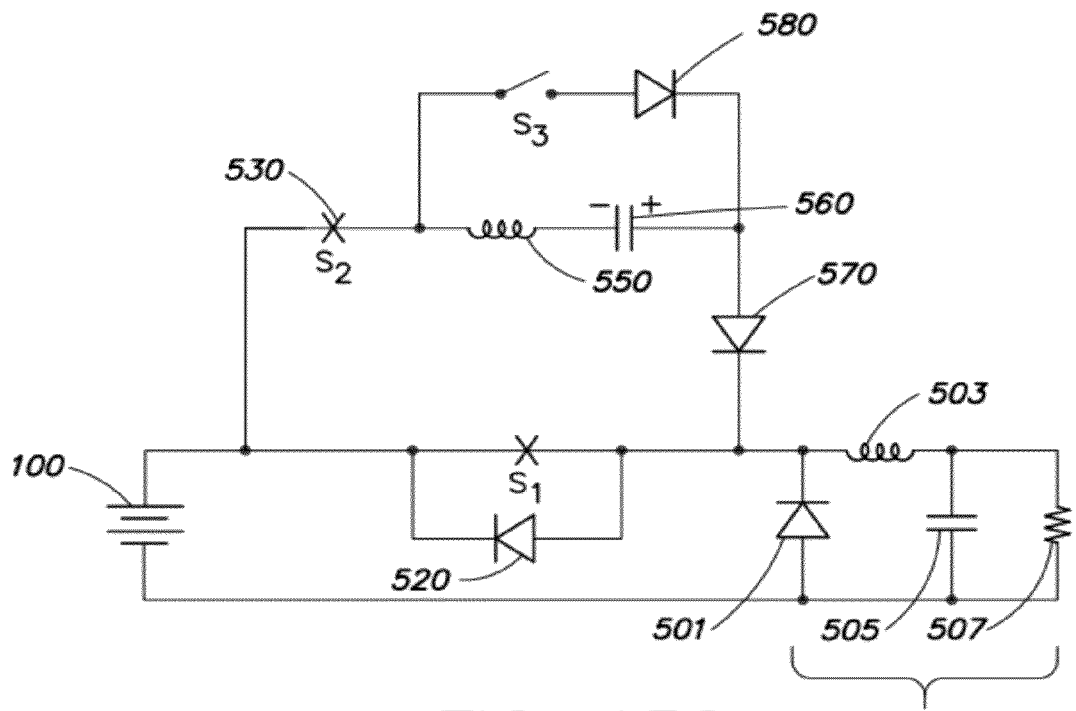
FIG. 13C is a schematic circuit diagram showing the switching topology of FIG. 5 in a third state during the soft switching procedure for a turn-off transition, according to aspects of the invention.
Figure 13D:
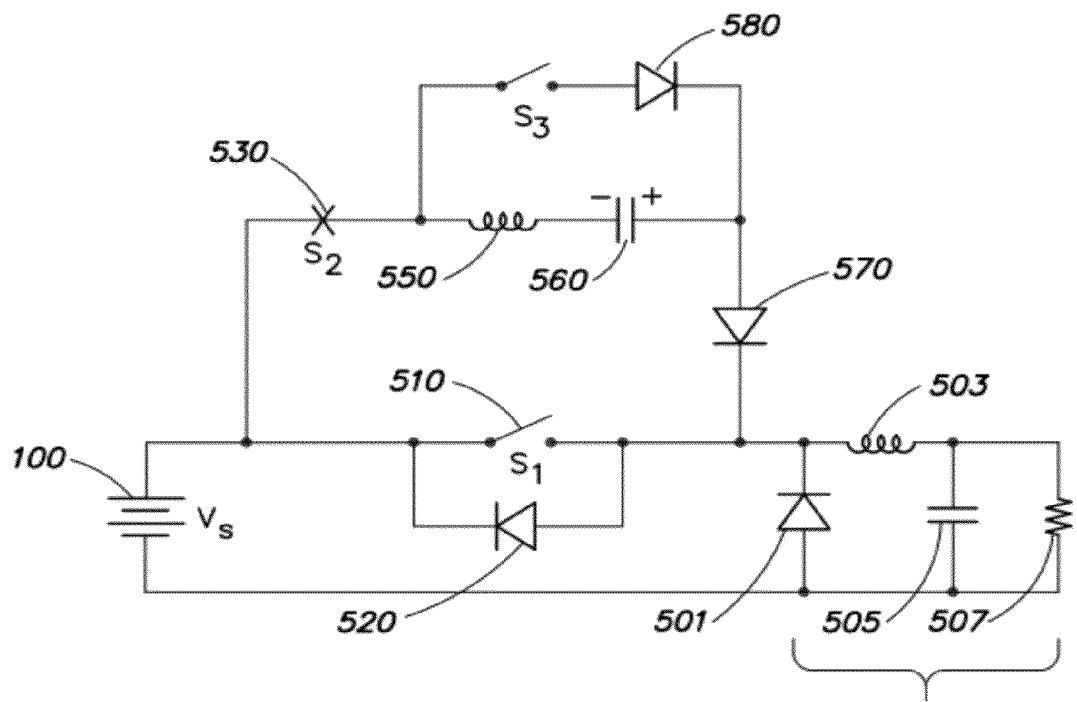
FIG. 13D is a schematic circuit diagram showing the switching topology of FIG. 5 in a fourth state during a soft switching procedure for the turn-off transition, according to aspects of the invention.
Figure 14A:
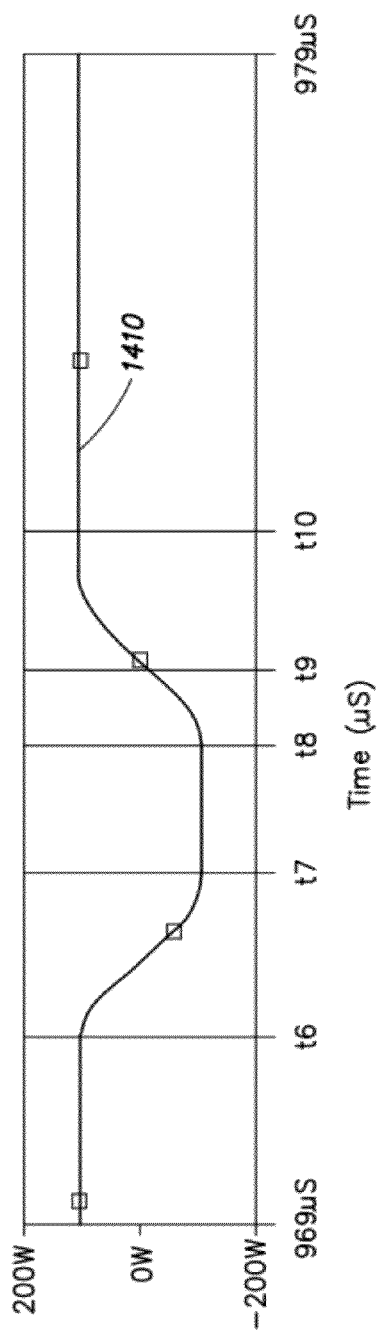
FIG. 14A is a timing diagram illustrating an example of capacitor voltage as a function of time for the circuit of FIG. 5 and method of FIG. 12, according to aspects of the invention.
Figure 14B:
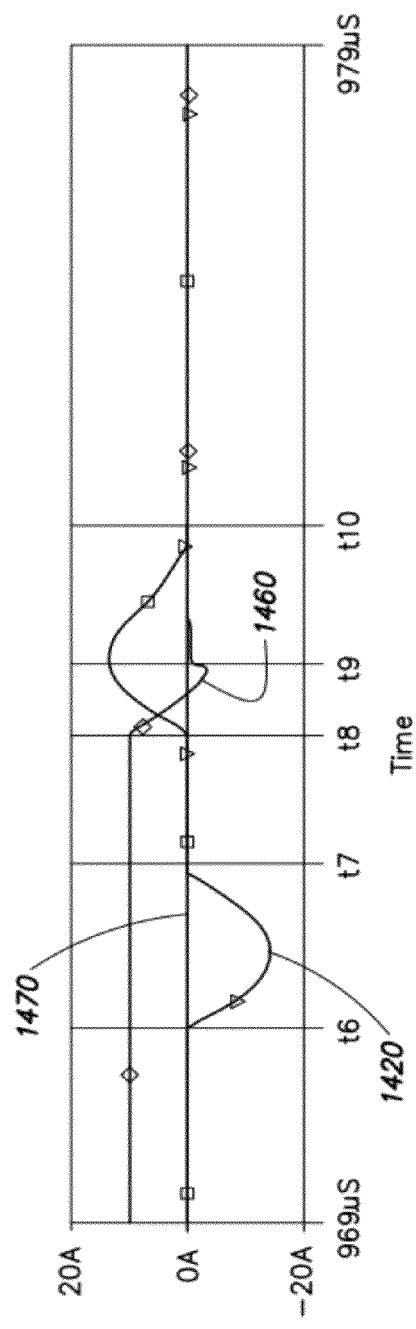
FIG. 14B is a timing diagram illustrating an example of currents in the circuit of FIG. 5 during a turn-off transition of switch S1, according to aspects of the invention.
Figure 14C:
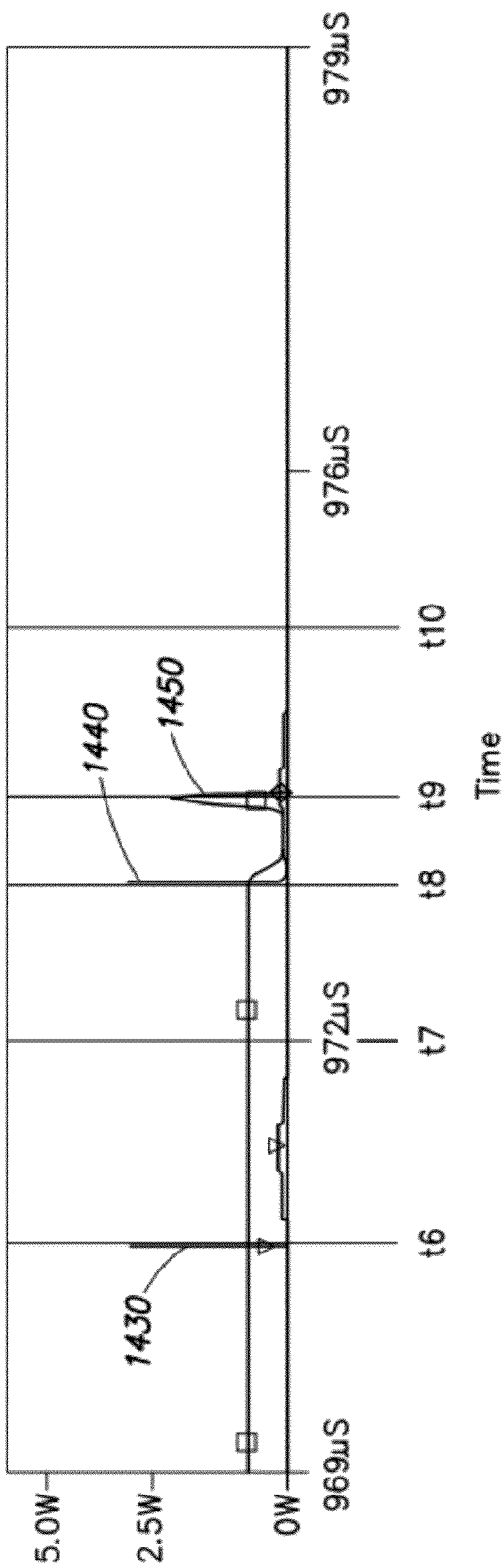
FIG. 14C is a timing diagram illustrating an example of power loss in the switches of the circuit of FIG. 5 during a turn-off transition of switch S1, according to aspects of the invention.

At time t=t9, the switch S1 is turned off (step 1240), and the circuit 500 enters the state shown in FIG. 13D. As discussed above and shown in FIG. 6, the time period from time t=t8 to time t=t9 has a duration T5, which, as discussed above, in one example is approximately given by:

$$T5 = \pi/2\sqrt{LC} \quad (1C)$$

Figure 15A:
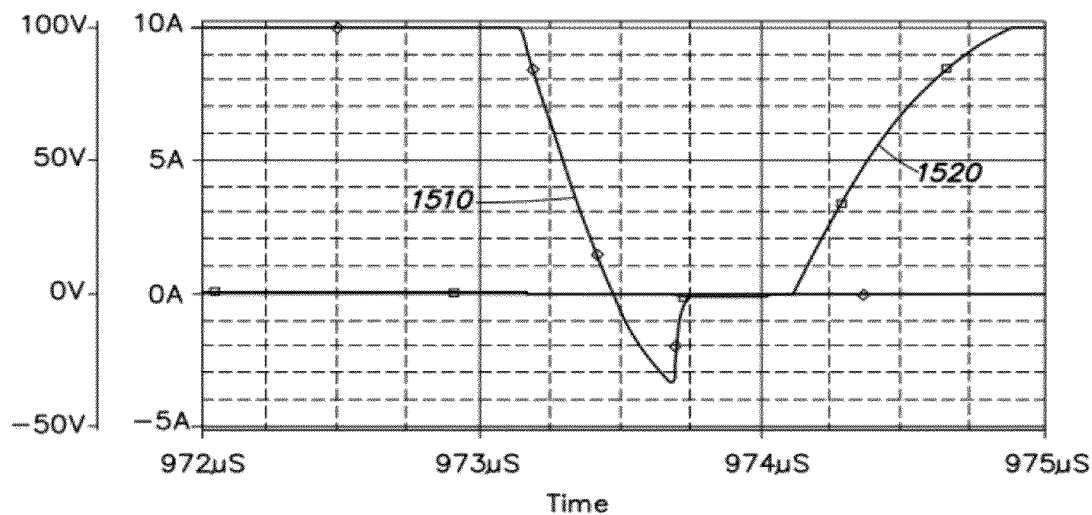
FIG. 15A is a graph of current and switch voltage (in Amps and Volts, respectively on the vertical axis) in switch S1 as a function of time (in microseconds along the horizontal axis) for the circuit of FIG. 5 during a turn-off transition of the switch S1.
Figure 15B:
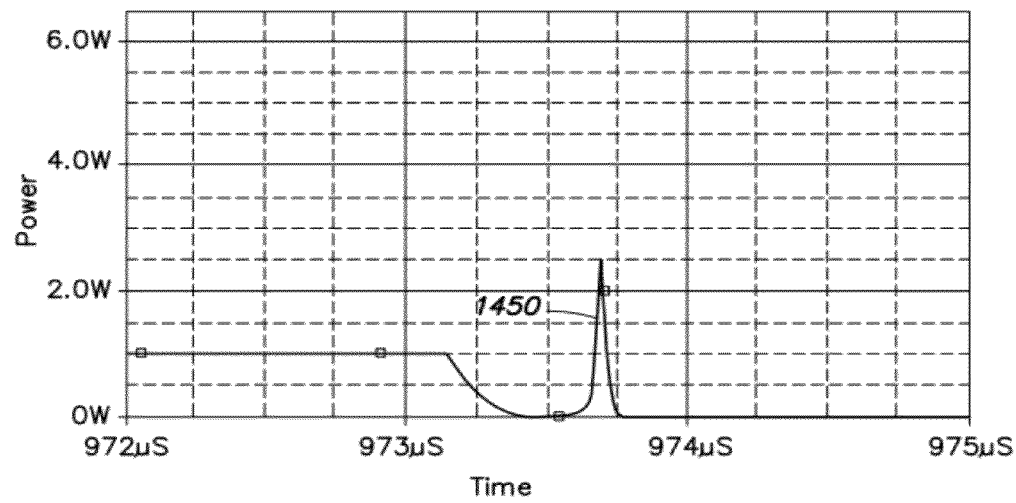
FIG. 15B is a graph of power loss in the switch S1 (in Watts on the vertical axis) as a function of time (in microseconds along the horizontal axis), corresponding to the graph of FIG. 15A.

At time t=t9, the voltage across the capacitor 560 is approximately zero (as shown in FIG. 14A), and the resonant current through the inductor 550 is close to its peak level, as shown in FIG. 14B. As discussed above, closing switch 530 at time t8 caused the current in the switch S1 to decrease (as shown in FIG. 14B), as the resonant current increased. As a result, because the peak resonant current is greater than the current in switch S1 at time t9, the diode 520 is forward biased and the voltage across the switch 510 becomes close to zero, enabling soft switching of switch S1. Referring to FIG. 15A, during turn-off of switch S1, the current 1510 in the switch drops to close to zero before the voltage 1520 across the switch begins to rise. As a result, the power loss during the switch transition is small, about 2.5 W in the example illustrated in FIG. 15B. This small power loss is also shown (trace 1450) in FIG. 14C.

According to one embodiment, the circuit 500 remains in the state shown in FIG. 13D, with switch 530 closed, for a time period of duration T2. After switch S1 has been turned off, the resonant current flows into the load 110. In one example, the time period T2 can be considered as the sum of two time periods T6 and T7, as shown in FIG. 6. T7 is a time period equivalent to ½*Tr, where Tr is the resonant time period of the resonant circuit foamed by the inductor 550 and capacitor 560, as discussed above. Switch S1 is turned off during time period T7. In one example, the switch S1 is turned off approximately half way through time period T7 and therefore, T5 is approximately ¼*Tr. According to one example, the circuit 500 remains in the state shown in FIG. 13D for a relatively extended period in order to recharge the capacitor 560 after the circuit 500 has been in the resonant mode shown in FIG. 13C. In one example, the time period T6 is the minimum time to recharge the capacitor 560 to the off-state voltage of the switch S1. Maintaining the circuit 500 in the state shown in FIG. 13D for the additional time period T6 after T7 allows for charge replenishment of the capacitor 560 that may have lost charge in the various losses in the auxiliary switches S2 and S3 and the diodes 570 and 580.

Referring to FIGS. 14A and 14B, after the current in switch 530 (S2) and inductor 550 (traces 1420 and 1470) has decreased to approximately zero, and the voltage (trace 1410) across the capacitor 560 is close to (or has reached) its peak value, at time t=t10, the switch 530 can be turned off (step 1250), as shown in FIG. 6. As the current through the switch 530 is close to zero at the time of the turn-off transition, the switch 530 experiences soft, and close to loss-less, switching. In one example, the reversal switch 540 may be used for reduced current stresses in case of current source switching. Once the switch 530 has been turned off (opened), the turn-off transition for the switch S1 is complete, and the circuit 500 is once again in the state shown in FIG. 5.

According to one embodiment, the values of the capacitor (C) and inductor (L) may be selected based on the minimum on time/off time desired for the circuit and also the peak current that the main switch S1 would break or make. It may be also important to know how much time will be taken by the main switch S1 to turn off (and the tolerance of this transition time) once the switch S1 is given a turn-off command. As discussed above, implementing the soft switching technique takes some amount of time, slowing down the switching transition. In one example, the band of time available (transition time) for the soft switching is given by:

$$T_{band} = \sqrt{LC\left(\pi - \sin^{-1}\left(\frac{I_0}{V\sqrt{\frac{C}{L}}}\right)\right)} \quad (2)$$

In equation (2), $I_o$ is the largest load current to be broken by the switch S1, and V is the minimum voltage that comes across the capacitor 560 after the switch S1 is turned on. In one example, the switch S1 is turned on or off after a time period:

$$T5 = \pi/2\sqrt{LC}$$

Accordingly, the available time to turn on/off the switch S1 is $T_{band}/2$. Therefore:

$$\frac{T_{band}}{2} \geq T_{on}, T_{off} \quad (3)$$

In equation (3), $T_{on}$ is the total on time of the main switch S1, while $T_{off}$ is total off time of the main switch S1.

Assuming the peak current allowed/desired in the circuit 500 is $I_p$, then the values of C and L are constrained according to the equation:

$$I_p \geq V_{cmax}\sqrt{\frac{C}{L}} \quad (4)$$

In equation (4), $V_{cmax}$ is the maximum capacitor voltage at any instant of operation of the circuit 500. Accordingly, the capacitor 560 may be voltage rated for $V_{cmax}$ and the minimum dv/dt or current rating of the capacitor may be given by:

$$(dv/dt)_{min} = V_{cmax}\sqrt{LC} \quad (5)$$

According to one embodiment, the root mean squared (rms) current in the inductor 550 passes about two resonant cycles for one switching period $T_s$. Accordingly, the inductor rms current is given by:

$$I_{lrms} = \frac{2\sqrt{2}\,\pi V_{cmax} C}{T_s} \quad (6)$$

Ts is minimum switching time period for proper operation of a converter system in which the switch is used. Ts may be greater than or equal to 2*T1(min) derived in equation 1A. This is a parameter decided by the designer of the converter system in which the switching method and apparatus of embodiments of the invention may be applied. For example, if the switching converter is required to operate at a max frequency of 100 kHz, Ts will be 10 µs.

The inductor air gap may be specified to account for a high current peak and to provide fair linearity during the entire period of resonance. The air gap, $L_g$, for the inductor 550 may be specified as follows:

$$L_g = \frac{n^2 \mu_0 A_c}{L} \quad (7)$$

In equation (7), n is number of turns on the inductor 550, $\mu_0$ is permeability of air, and $A_c$ is the cross-sectional area of the inductor core. To ensure linearity of operation, the following condition should also be satisfied:

$$B_{max} \geq \frac{\mu_0 V_{cmax}}{L_g}\sqrt{\frac{C}{L}} \quad (8)$$

Where $B_{max}$ is the maximum flux density allowed in the core material. The value L of the inductor 550 may be selected as any value that will satisfy equations (6), (7) and (8).

In one example, the auxiliary switches 530 (S2) and 540 (S3), as well as the diodes 570 and 580 may be rms current rated according to equation (6), and may be rated for peak repetitive current ($I_{prr}$) as follows:

$$I_{prr} = V_{cmax}\sqrt{\frac{C}{L}} \quad (9)$$

Fast switches and diodes may be generally presently preferred.

Figure 16:
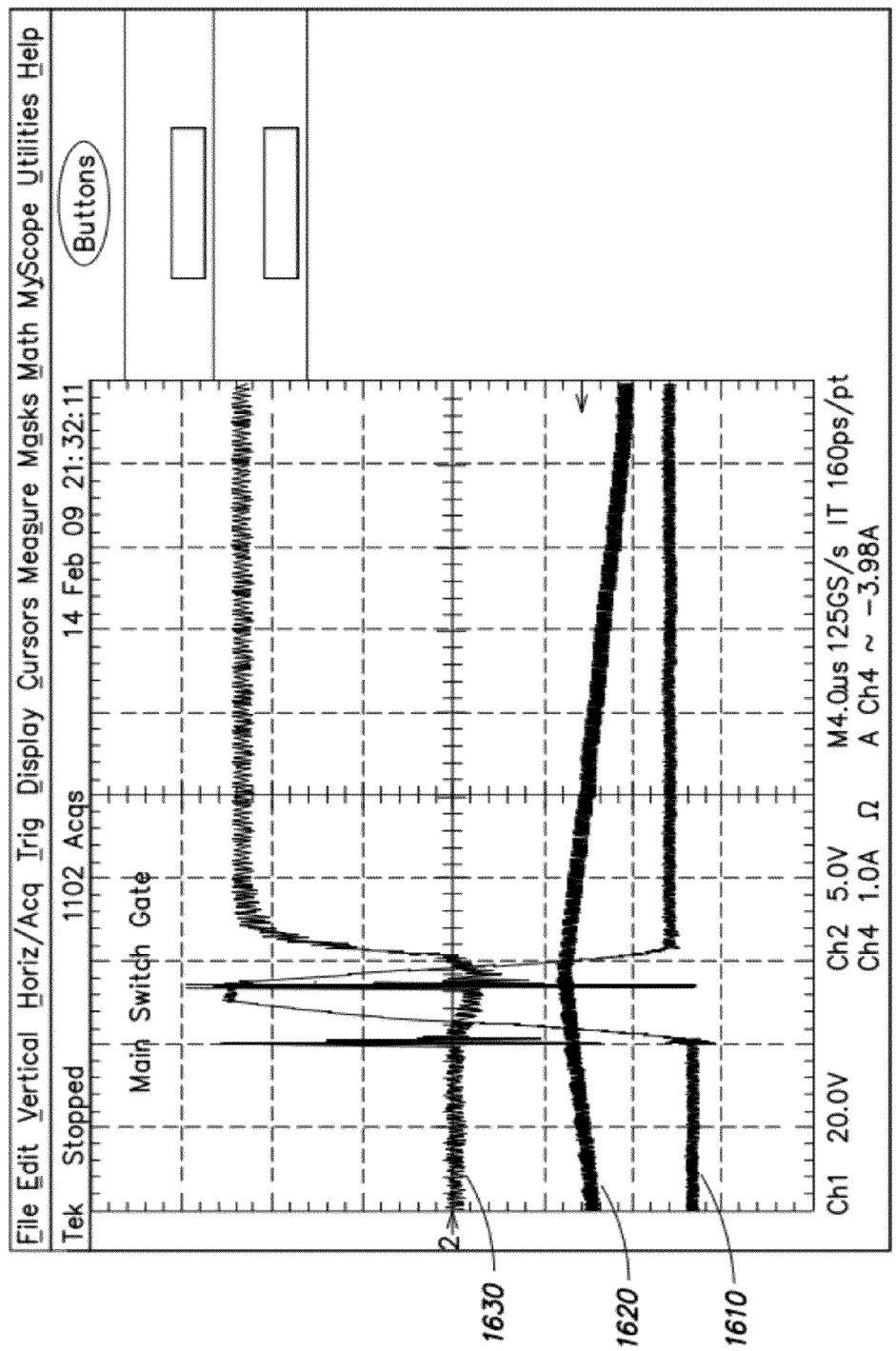
FIG. 16 is a screen shot of a measurement device illustrating example measured signals in a circuit such as that illustrated in FIG. 5, according to aspects of the invention.
Figure 17:
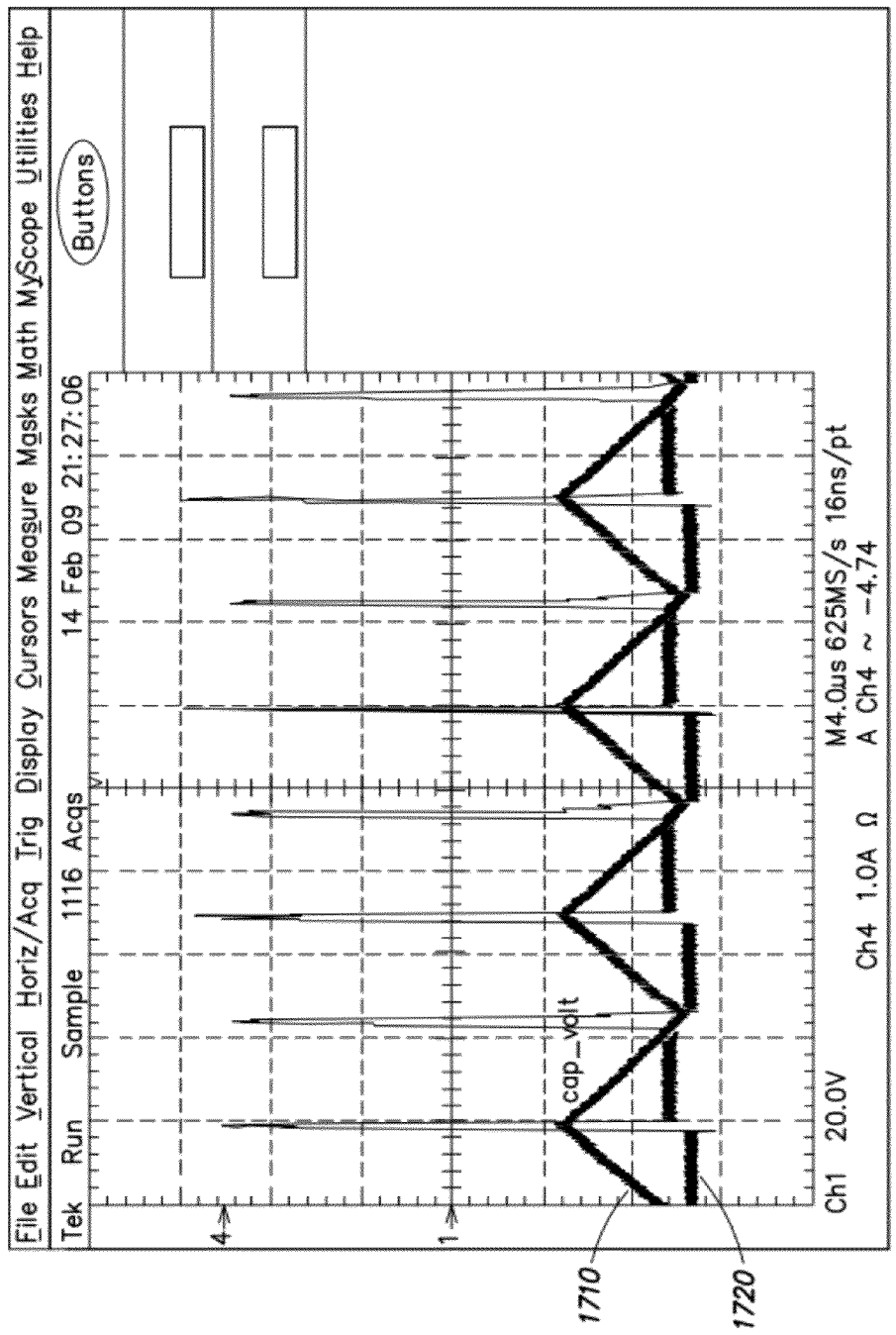
FIG. 17 is a screen shot of a measurement device illustrating example measured signals in a circuit such as that illustrated in FIG. 5, according to aspects of the invention.
Figure 18:
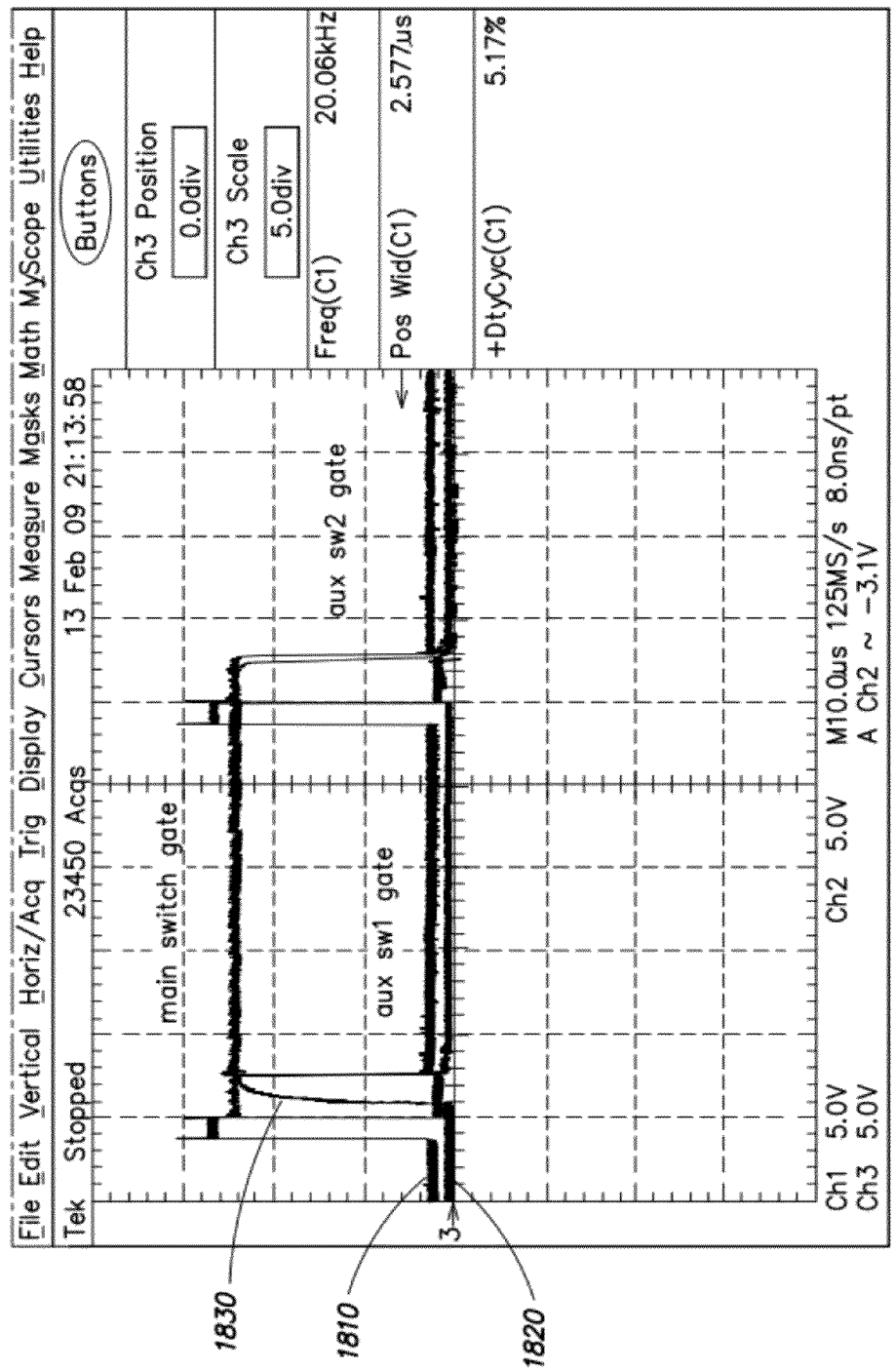
FIG. 18 is a screen shot of a measurement device illustrating example measured signals in a circuit such as that illustrated in FIG. 5, according to aspects of the invention.

An example of a zero voltage switch having a circuit similar to that shown in FIG. 5 was implemented and used to convert a hard switching device used with a buck converter into a soft switch. In one example, for a 120 Watt system, an improvement in the switching efficiency from 85% to 93% was observed. Referring to FIG. 16, there are illustrated some of the measured waveforms for this example. In FIG. 16, trace 1610 represents the voltage across the capacitor 560. Trace 1610 shows the charging of the capacitor 560 in the positive and negative direction during the turn-on process of switch S1. As can be seen in FIG. 16, there is a difference in the levels of the steady state capacitor voltage before and after the charge/discharge cycle. This difference represents a loss of charge that preferably may be replenished during the time period T6, as discussed above. In FIG. 16, trace 1620 represents the current in the inductor 503, and trace 1630 represents the voltage at the gate of the switch S1. As discussed above, the switch S1 is turned on close to the zero crossing of the second polarity change of the capacitor voltage 1610, such that the switch soft switches. FIG. 17 illustrates the time period of the soft switching operation for this example by showing the inductor (503) current (trace 1710) and capacitor (560) voltage (trace 1720) in the same plot. FIG. 18 illustrates the measured switching waveforms for the implemented example. In FIG. 18, trace 1810 represents the switch S3, trace 1820 represents the switch S2 and trace 1830 represents the switch S1. As can be seen with reference to FIG. 18, the switches S1, S2 and S3 are turned on and off as discussed above with reference to FIGS. 7 and 12 to achieve soft switching of switch S1. The example demonstrates that the soft switching techniques discussed herein may be practically implemented.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A switch circuit comprising:
   a first switch having a first node and a second node; and
   a switch control circuit coupled in parallel with the first switch between the first and second nodes, the switch control circuit comprising:
   a series resonant circuit including a capacitor and an inductor coupled together in series;
   a second switch coupled in parallel with the series resonant circuit;
   a third switch coupled in series between the first node and the series resonant circuit; and
   a first diode coupled between the series resonant circuit and the second node, a negative terminal of the first diode being coupled to the second node.

2. The switch circuit as claimed in claim 1, further comprising a second diode coupled between the second switch and a junction point of the series resonant circuit and the first diode.

3. The switch circuit as claimed in claim 1, further comprising a controller coupled to each of the first, second and third switches and configured to provide control signals to turn the first, second and third switches on and off.

4. The switch circuit as claimed in claim 3, wherein prior to turn on or turn off of the first switch, the controller is configured to control the third switch to reverse a polarity of a voltage across the capacitor.

5. The switch circuit as claimed in claim 4, wherein the controller is further configured to turn on the second switch, after the polarity of the voltage across the capacitor has been reversed, to discharge the capacitor.

6. The switch circuit as claimed in claim 5, wherein the controller is further configured to turn the first switch on or off at approximately at zero-crossing point of the voltage across the capacitor.

7. The switch circuit as claimed in claim 1, wherein the switching circuit is included in a power converter, wherein the first switch is repeatedly switched on and off.

8. A method of operating a control circuit to actuate a switch, the control circuit comprising a series resonant circuit including a capacitor and an inductor, a first auxiliary switch coupled between a first node of the switch and an input of the series resonant circuit, a diode coupled between an output of the series resonant circuit and a second node of the switch, and a second auxiliary switch coupled in parallel with the series resonant circuit, the method comprising:
turning on the second auxiliary switch;
turning off the second auxiliary switch after a polarity of a voltage across the capacitor has been reversed;
turning on the first auxiliary switch to discharge the capacitor; and
actuating the switch at approximately a zero-crossing point of the voltage across the capacitor.

9. The method as claimed in claim 8, further comprising: turning off the first auxiliary switch after turning on the switch.

10. The method as claimed in claim 8, wherein a time period between turning on the second auxiliary switch and turning off the second auxiliary switch is at least $\pi\sqrt{LC}$;
wherein L is a value of an inductance of the inductor of the series resonant circuit and C is a value of a capacitance of the capacitor of the series resonant circuit.

11. The method as claimed in claim 8, further comprising: repeatedly turning the switch on and off; and
continually charging and discharging the capacitor included in the series resonator circuit.

12. A method of operating a switch comprising:
reducing a voltage across the switch to approximately zero by generating a first resonant current responsive to an instruction to turn on the switch;
closing the switch when the voltage across the switch is approximately zero, wherein the voltage across the switch reduces to approximately zero prior to closing the switch;
reducing a current through the switch to approximately zero by generating a second resonant current responsive to an instruction to turn off the switch; and
opening the switch when the current is approximately zero, wherein the current across the switch reduces to approximately zero prior to opening the switch.

13. The method as claimed in claim 12, wherein generating the first resonant current includes generating the first resonant current in a resonant circuit coupled in parallel with the switch.

14. The method as claimed in claim 13, wherein the resonant circuit includes a capacitor and wherein reducing the voltage across the switch includes:
reversing a polarity of a voltage across the capacitor; and
actuating the switch at approximately a zero-crossing point of the voltage across the capacitor.

15. The method as claimed in claim 14, wherein the resonant circuit further includes an inductor and wherein reducing the voltage across the switch further includes increasing a current through the inductor until a current peak is reached at approximately the zero-crossing point.

16. The method as claimed in claim 15, further comprising determining a time period the switch is actuated as a function of a resonant time period of the resonant circuit formed by the capacitor and the inductor.

17. The method as claimed in claim 12, wherein generating the second resonant current includes generating the second resonant current in a resonant circuit coupled in parallel with the switch.

18. The method as claimed in claim 17, wherein the resonant circuit includes a capacitor and wherein reducing the current through the switch includes:
reversing a polarity of a voltage across a capacitor; and
actuating the switch at approximately a zero-crossing point of the voltage across the capacitor.

19. The method as claimed in claim 18, wherein the resonant circuit includes an inductor and wherein reducing the current across the switch further includes increasing a current through the inductor until a current peak is reached at approximately the zero-crossing point.

20. The method as claimed in claim 12, further comprising reducing a power loss associated with the switch during a time period the switch is actuated.

* * * * *